United States Patent
Hong et al.

(10) Patent No.: US 11,329,024 B2
(45) Date of Patent: *May 10, 2022

(54) SEMICONDUCTOR PACKAGE

(71) Applicant: Samsung Electronics Co., Ltd., Suwon-si (KR)

(72) Inventors: Ji-seok Hong, Yongin-si (KR); Jin-woo Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,084

(22) Filed: Jul. 29, 2020

(65) Prior Publication Data
US 2020/0365555 A1   Nov. 19, 2020

Related U.S. Application Data

(63) Continuation of application No. 16/366,044, filed on Mar. 27, 2019, now Pat. No. 10,790,264.

(30) Foreign Application Priority Data

Sep. 3, 2018 (KR) .......................... 10-2018-0104702

(51) Int. Cl.
*H01L 25/065* (2006.01)
*H01L 21/768* (2006.01)
(Continued)

(52) U.S. Cl.
CPC .... *H01L 25/0652* (2013.01); *H01L 21/76898* (2013.01); *H01L 23/481* (2013.01);
(Continued)

(58) Field of Classification Search
CPC .............. H01L 25/0652; H01L 23/481; H01L 21/76898; H01L 25/105
See application file for complete search history.

(56) References Cited

U.S. PATENT DOCUMENTS 8,338,294 B2   12/2012   Sadaka
8,546,188 B2   10/2013   Liu
(Continued)

FOREIGN PATENT DOCUMENTS

EP      3096349 A1    11/2016

OTHER PUBLICATIONS

European Search Report dated Dec. 2, 2019 issued in corresponding European Application No. 19162118.4.

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

A semiconductor package including a first device layer including first semiconductor devices, a first cover insulating layer, and first through-electrodes passing through at least a portion of the first device layer, a second device layer second semiconductor devices, a second cover insulating layer, and second through-electrodes passing through at least a portion of the second device layer, the second semiconductor devices vertically overlapping the first semiconductor devices, respectively, the second cover insulating layer in contact with the first cover insulating layer a third device layer including an upper semiconductor chip, the upper semiconductor chip vertically overlapping both at least two of first semiconductor devices and at least two of the second semiconductor devices, and device bonded pads passing through the first and second cover insulating layers, the device bonded pads electrically connecting the first and second through-electrodes to the upper semiconductor chip may be provided.

20 Claims, 38 Drawing Sheets

(51) Int. Cl.
*H01L 23/48* (2006.01)
*H01L 23/00* (2006.01)
*H01L 25/00* (2006.01)

(52) U.S. Cl.
CPC .............. *H01L 24/08* (2013.01); *H01L 24/80* (2013.01); *H01L 24/94* (2013.01); *H01L 25/50* (2013.01); *H01L 2224/08146* (2013.01); *H01L 2224/80895* (2013.01); *H01L 2225/06513* (2013.01); *H01L 2225/06524* (2013.01); *H01L 2225/06527* (2013.01); *H01L 2225/06544* (2013.01); *H01L 2225/06555* (2013.01); *H01L 2225/06586* (2013.01)

(56) References Cited

U.S. PATENT DOCUMENTS

| | | | |
|---|---|---|---|
| 9,589,936 B2 | 3/2017 | Zhai et al. | |
| 9,659,907 B2 | 5/2017 | Zhai et al. | |
| 9,666,559 B2 | 5/2017 | Wang et al. | |
| 9,726,689 B1 | 8/2017 | Desai et al. | |
| 9,761,569 B2 | 9/2017 | Yap | |
| 9,972,609 B2 | 5/2018 | Tao et al. | |
| 10,790,264 B2* | 9/2020 | Hong | H01L 24/96 |
| 2008/0138982 A1* | 6/2008 | Uchiyama | H01L 25/0657 |
| | | | 438/675 |
| 2010/0187671 A1 | 7/2010 | Lin | |
| 2011/0058348 A1 | 3/2011 | Sakai et al. | |
| 2011/0298011 A1 | 12/2011 | Lee | |
| 2012/0193788 A1 | 8/2012 | Fu | |
| 2014/0077390 A1 | 3/2014 | Watanabe | |
| 2014/0203433 A1 | 7/2014 | Kinser | |
| 2016/0181228 A1 | 6/2016 | Higuchi | |
| 2016/0373629 A1 | 12/2016 | Jung et al. | |
| 2017/0179078 A1 | 6/2017 | Jung et al. | |
| 2018/0025970 A1 | 1/2018 | Kao | |
| 2018/0108606 A1 | 4/2018 | Scanlan et al. | |
| 2018/0130782 A1 | 5/2018 | Lee | |
| 2019/0088634 A1 | 3/2019 | Tsukiyama et al. | |
| 2019/0279965 A1 | 9/2019 | Lattard | |
| 2020/0035672 A1 | 1/2020 | Thei | |

* cited by examiner

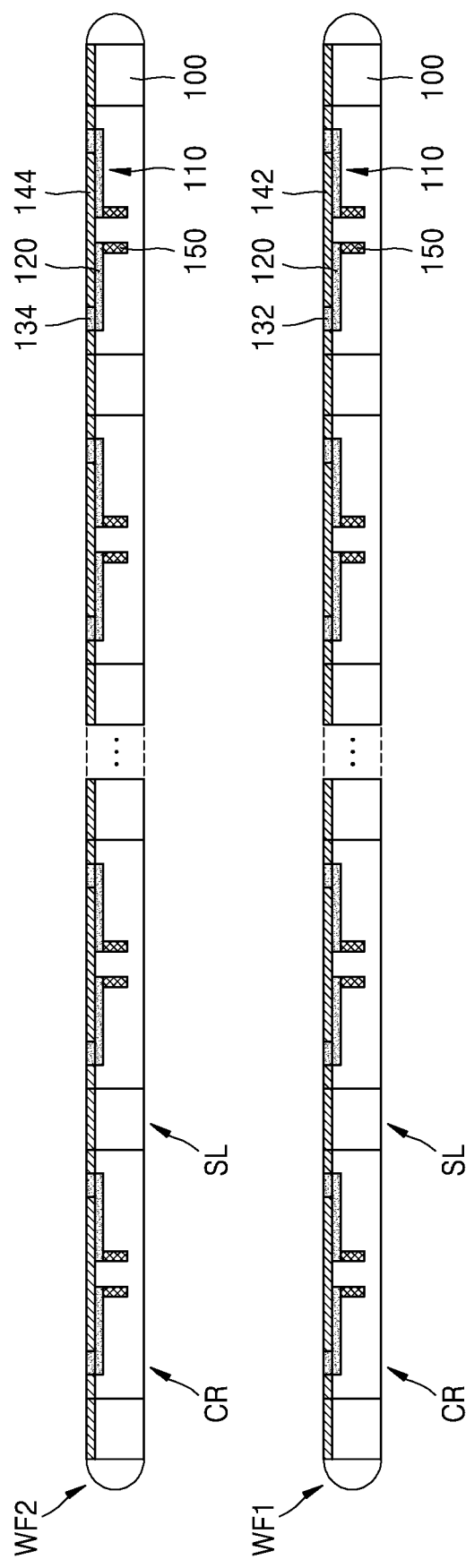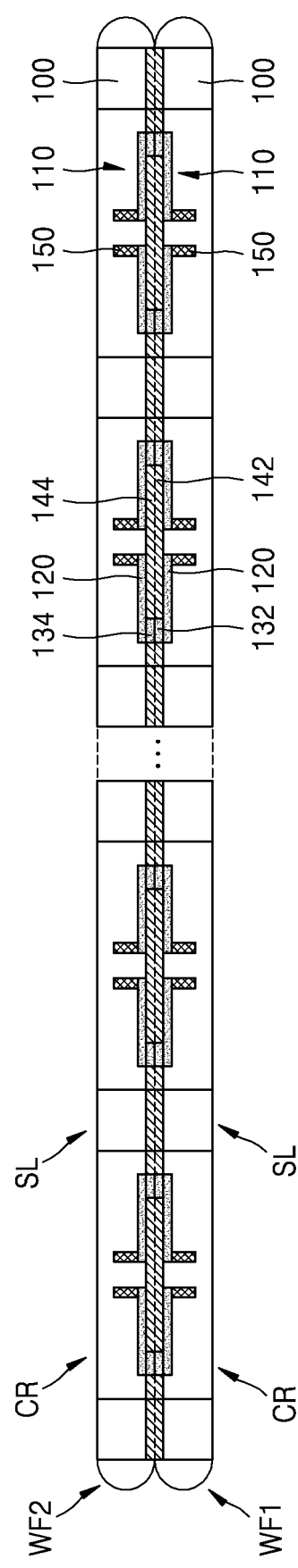

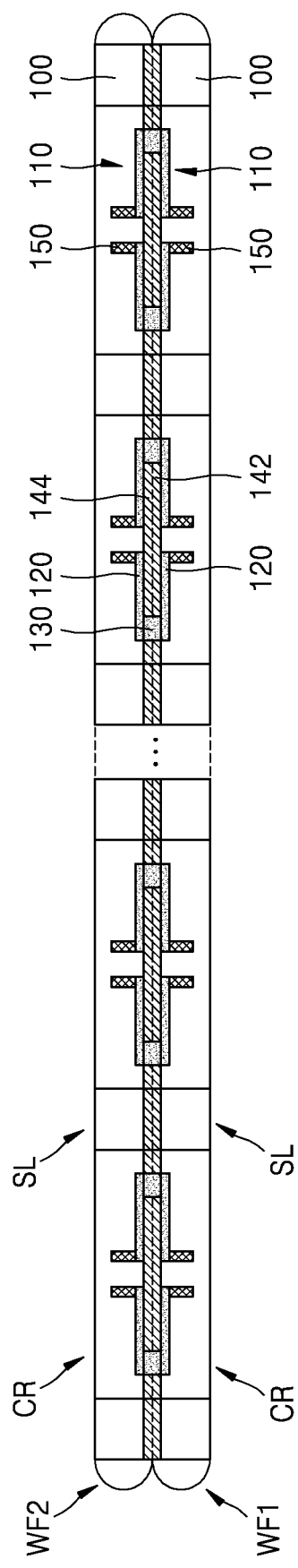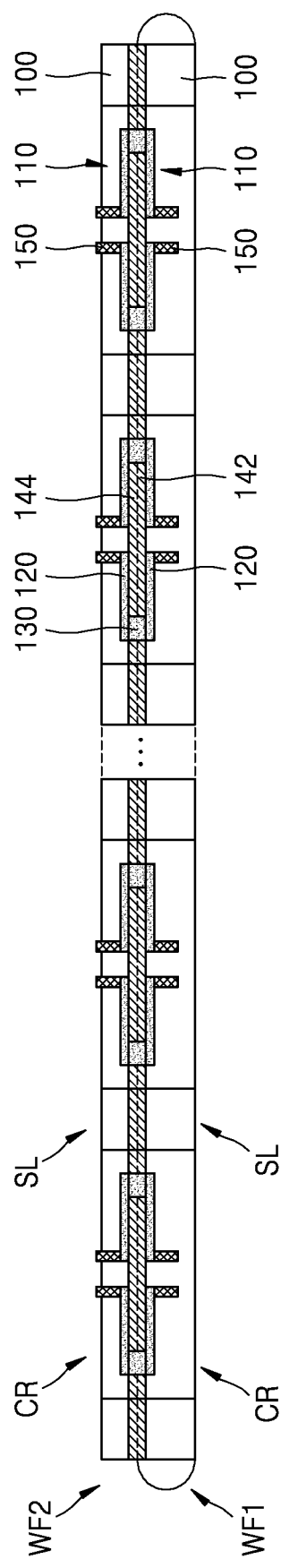

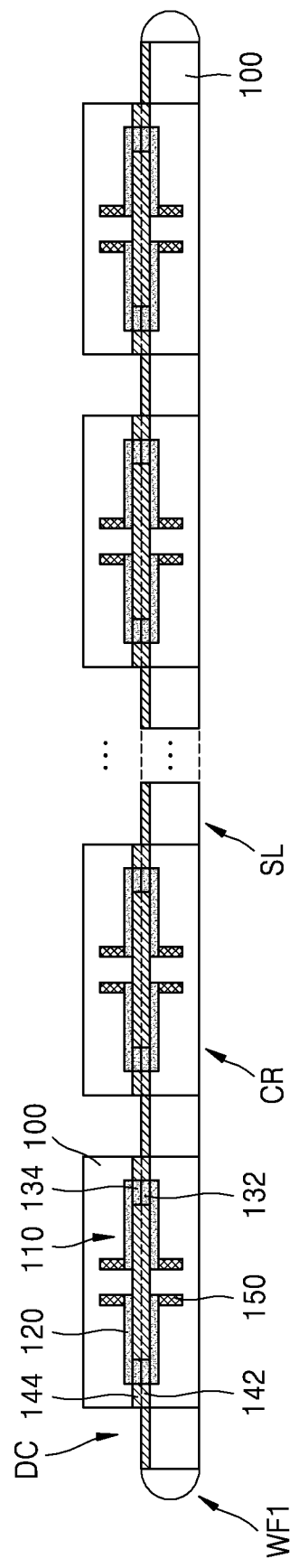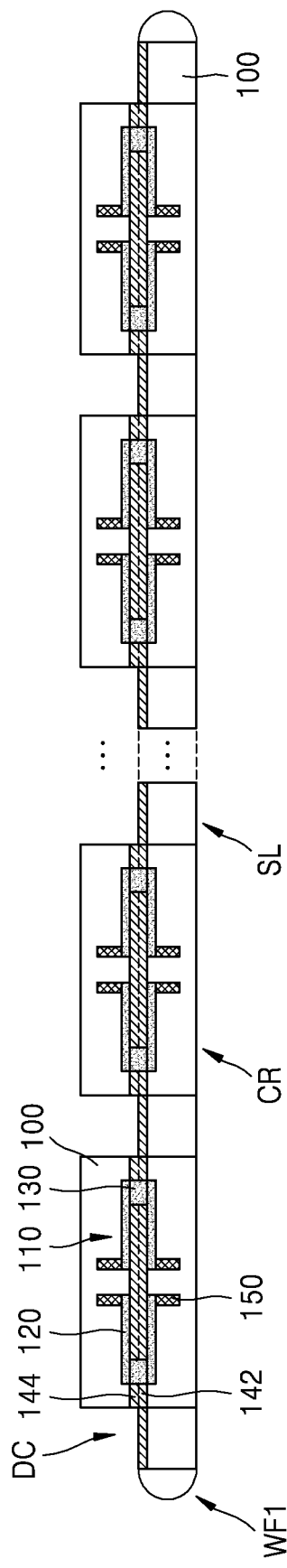

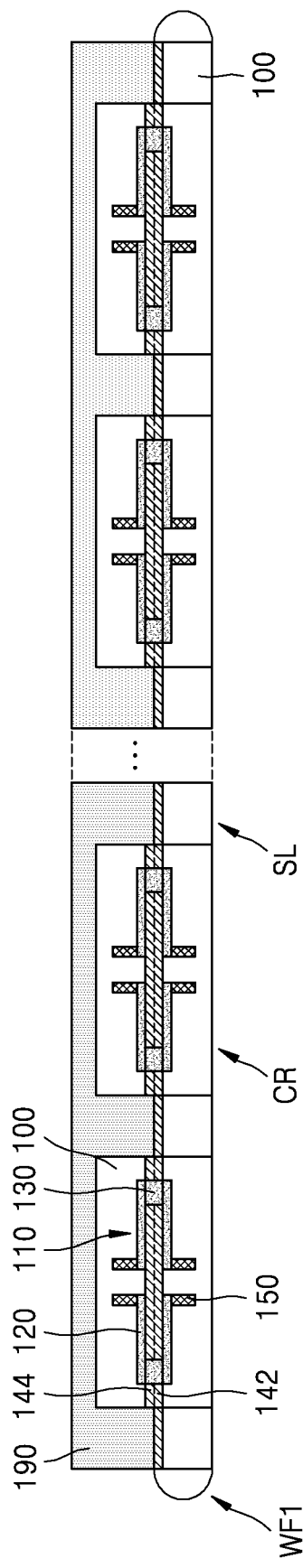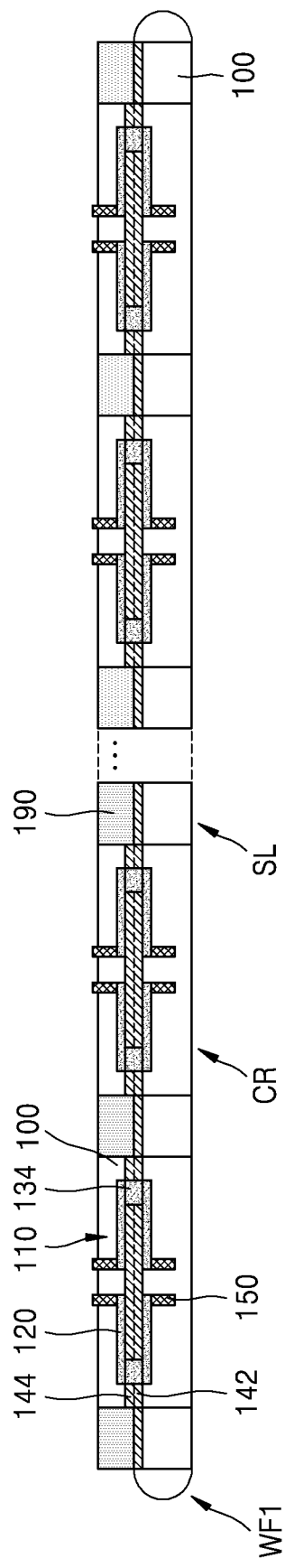

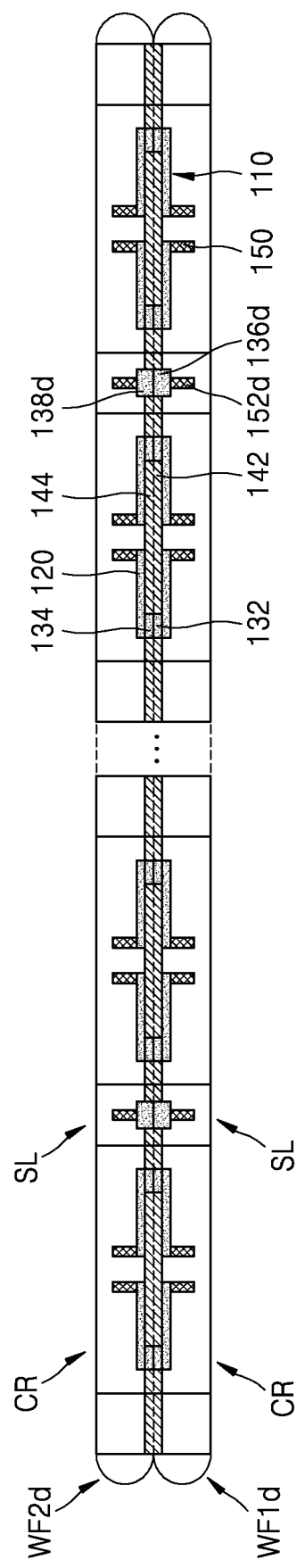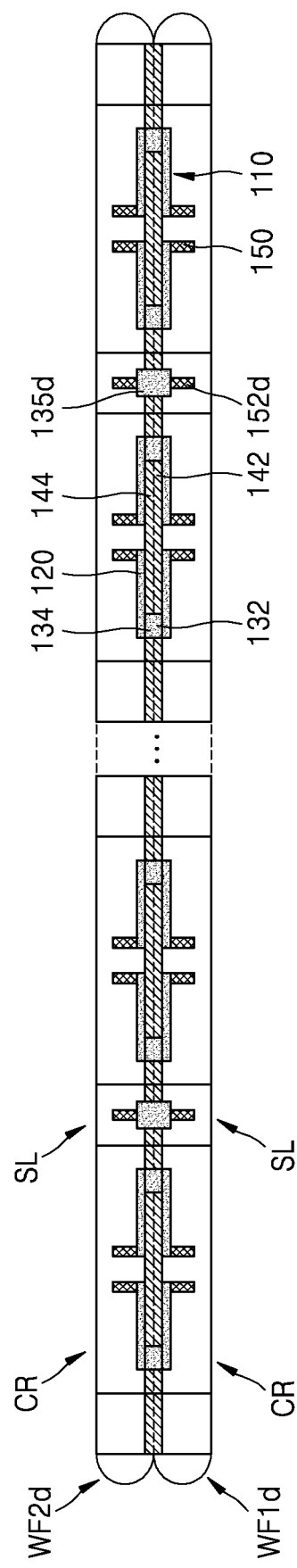

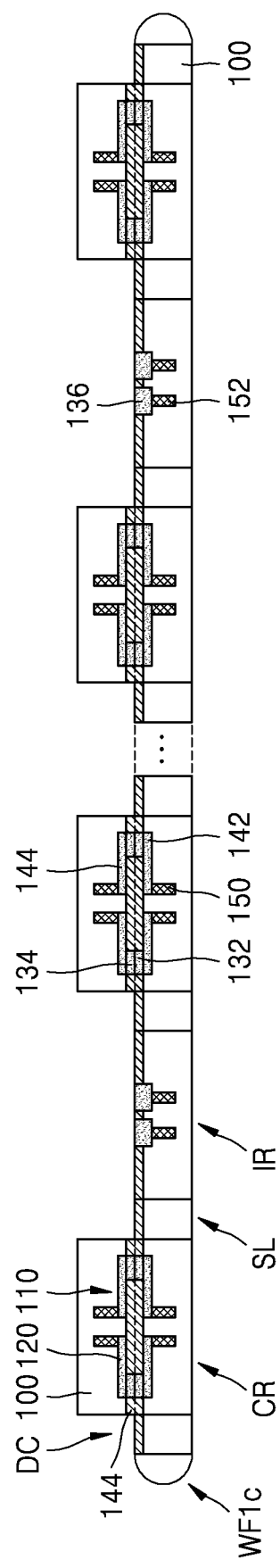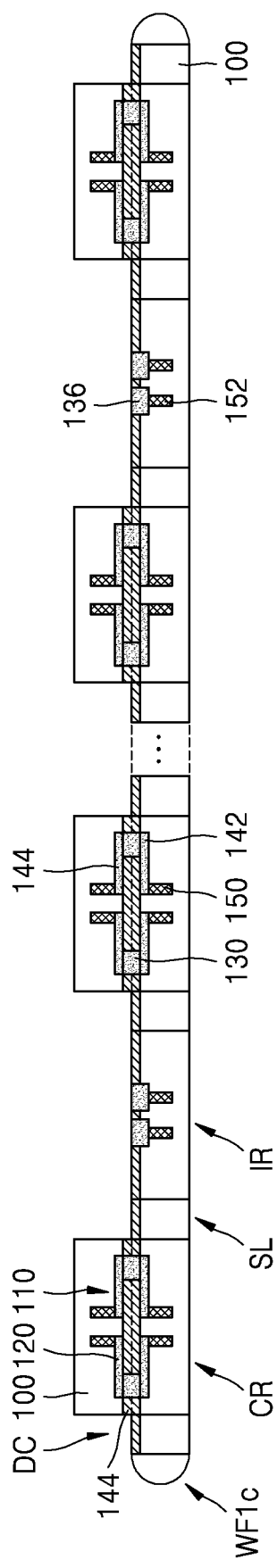

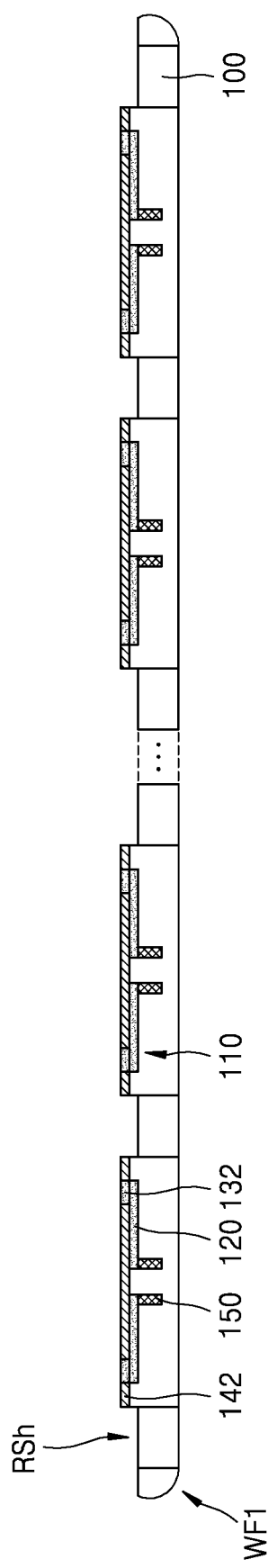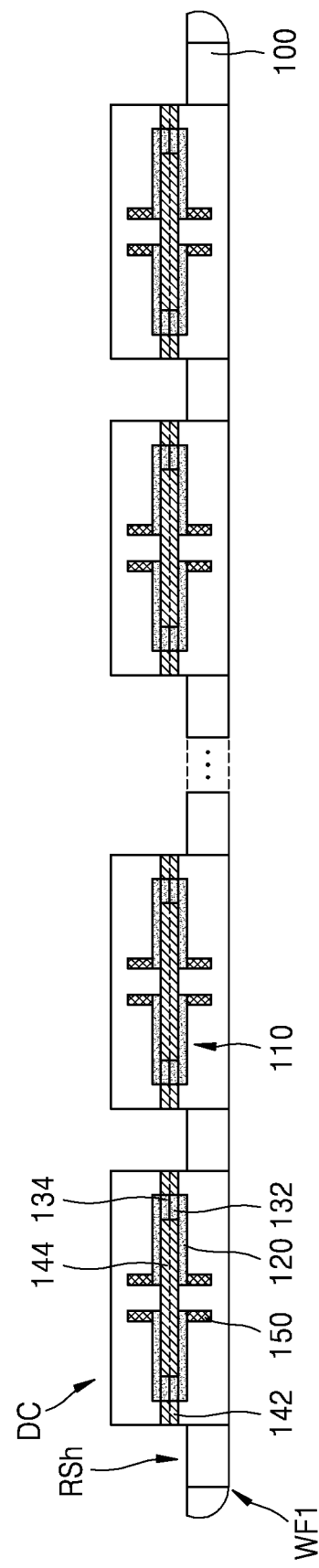

SEMICONDUCTOR PACKAGE

CROSS-REFERENCE TO RELATED APPLICATION

This application is a continuation of U.S. application Ser. No. 16/366,044, filed on Mar. 27, 2019, which claims priority under 35 U.S.C. § 119 to Korean Patent Application No. 10-2018-0104702, filed on Sep. 3, 2018, in the Korean Intellectual Property Office, the disclosure of each of which is incorporated herein in its entirety by reference.

BACKGROUND

The inventive concepts relate to semiconductor packages, and more particularly, to semiconductor packages including a plurality of semiconductor chips.

As the electronics industry advances and user demand increases, electronic devices are manufactured to have more compact designs, more multi-functionality, and/or higher storage capacities. Accordingly, a semiconductor package including two or more types of semiconductor chips is desired and a printed circuit board (PCB) or an interposer may be used for electrical connection between different types of semiconductor chips. However, it is difficult to implement a fine pitch when a PCB is used, and it is difficult to avoid an increase in manufacturing cost when an interposer is used.

SUMMARY

At least one or more inventive concepts provide semiconductor packages including a plurality of semiconductor chips having a relatively small form factor, a relatively fine pitch, and/or a relatively low cost.

According to an example embodiment, a semiconductor package includes a first device layer including a plurality of first semiconductor devices, a first cover insulating layer, and a plurality of first through-electrodes passing through at least a portion of the first device layer, a second device layer including a plurality of second semiconductor devices, a second cover insulating layer, and a plurality of second through-electrodes passing through at least a portion of the second device layer, the plurality of second semiconductor devices vertically overlapping the plurality of first semiconductor devices, respectively, the second cover insulating layer in contact with the first cover insulating layer a third device layer including an upper semiconductor chip, the upper semiconductor chip vertically overlapping at least two of the plurality of first semiconductor devices and vertically overlapping at least two of the plurality of second semiconductor devices, and a plurality of device bonded pads passing through the first cover insulating layer and the second cover insulating layer, the plurality of device bonded pads electrically connecting the plurality of first through-electrodes and the plurality of second through-electrodes to the upper semiconductor chip.

According to an example embodiment, a semiconductor package includes a first device layer, second device layer, a third device layer, and a plurality of device bonded pads. The first device layer may include (1) a first semiconductor substrate, (2) a plurality of first through-electrodes in the plurality of first semiconductor chip regions and passing through the first semiconductor substrate, and (3) a first cover insulating layer covering the active surface of the first semiconductor substrate. The first semiconductor substrate may have an active surface and may include one or more first scribe lanes and a plurality of first semiconductor chip regions spaced apart from one another with the one or more first scribe lane regions therebetween, each of the plurality of first semiconductor chip regions provided with a first semiconductor device on the active surface of the first semiconductor substrate. The second device layer may include (1) a second semiconductor substrate, (2) a plurality of second through-electrodes in the plurality of second semiconductor chip regions and passing through the second semiconductor substrate, and (3) a second insulating layer covering the active surface of the second semiconductor substrate and in contact with the first cover insulating layer. The second semiconductor substrate has an active surface and may include one or more second scribe lane regions and a plurality of second semiconductor chip regions spaced apart from one another with the one or more second scribe lane regions therebetween, each of the plurality of second semiconductor chip regions provided with a second semiconductor device on the active surface of the second semiconductor substrate, the second semiconductor device being of a same type as the first semiconductor device. The third device layer may include an upper semiconductor chip on the second device layer and electrically connected to the plurality of second through-electrodes. The plurality of device bonded pads may pass through the first cover insulating layer and the second cover insulating layer and electrically connect the first device layer to the second device layer.

According to an example embodiment, a semiconductor package includes a first semiconductor substrate having an active surface and including a plurality of scribe lane regions and a plurality of first semiconductor chip regions spaced apart from one another with corresponding ones of the plurality of scribe lane regions therebetween, each of the plurality of first semiconductor chip regions provided with at least one first semiconductor device on the active surface of the first semiconductor substrate, a plurality of first through-electrodes in the plurality of first semiconductor chip regions and passing through the first semiconductor substrate, a first cover insulating layer covering the active surface of the first semiconductor substrate, a plurality of lower semiconductor chips on the first semiconductor substrate and corresponding to the plurality of first semiconductor chip regions, respectively, each of the plurality of lower semiconductor chips including a second semiconductor substrate having an active surface on which a second semiconductor device is located, the second semiconductor substrate including a plurality of second through-electrodes passing therethrough, and a second cover insulating layer covering the active surface of the second semiconductor substrate and in contact with the first cover insulating layer, a plurality of device bonded pads passing through the first cover insulating layer and the second cover insulating layer and electrically connecting the plurality of first through-electrodes to the plurality of second through-electrodes, and an upper semiconductor chip including a third semiconductor device and vertically overlapping at least two of the plurality of lower semiconductor chips and electrically connected to the plurality of second through-electrodes.

BRIEF DESCRIPTION OF THE DRAWINGS

Example embodiments of the inventive concepts will be more clearly understood from the following detailed description taken in conjunction with the accompanying drawings in which:

FIGS. 1A through 1I are cross-sectional views sequentially illustrating a method of manufacturing a semiconductor package, according to an example embodiment;

FIGS. 5A through 5D are cross-sectional views sequentially illustrating a method of manufacturing a semiconductor package according to an example embodiment;

FIGS. 9A through 9C are cross-sectional views sequentially illustrating a method of manufacturing a semiconductor package according to an example embodiment;

FIGS. 11A through 11E are cross-sectional views sequentially illustrating a method of manufacturing a semiconductor package according to an example embodiment;

FIGS. 17A and 17B are cross-sectional views sequentially illustrating a method of manufacturing a semiconductor package, according to an example embodiment;

DETAILED DESCRIPTION

Figure 1E:
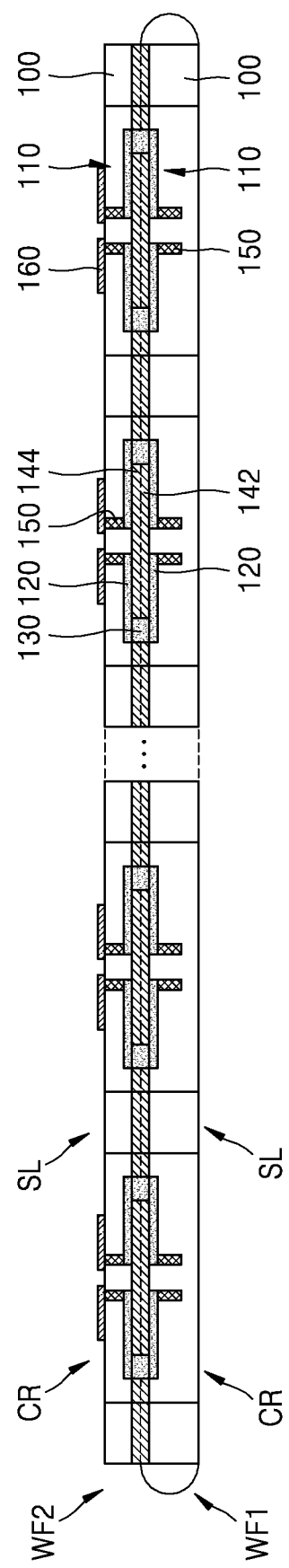

FIGS. 1A through 1I are cross-sectional views sequentially illustrating a method of manufacturing a semiconductor package 1 according to an example embodiment. FIG. 2 is a cross-sectional view of the semiconductor package 1 according to an example embodiment.

Referring to FIG. 1A, a first wafer WF1 and a second wafer WF2 are prepared. Each of the first wafer WF1 and the second wafer WF2 may include a plurality of semiconductor chip regions CR divided by scribe lane regions SL. The plurality of semiconductor chip regions CR refer to portions that are separated by a sawing process performed along the scribe lane regions SL from the first wafer WF1 or the second wafer WF2, and may operate as individual semiconductor chips.

In some example embodiments, the first wafer WF1 and the second wafer WF2 may be manufactured by using the same or substantially similar process. Accordingly, elements other than elements to be distinguished from each other or different elements from among elements of the first wafer WF1 and the second wafer WF2 may be denoted by the same reference numerals.

Each of the first wafer WF1 and the second wafer WF2 may include a first semiconductor substrate 100 including the plurality of semiconductor chip regions CR and the scribe lane regions SL. A first semiconductor device 110, a wiring structure 120, a plurality of first internal connection pads 132, a first cover insulating layer 142, and a plurality of through-electrodes 150 may be located in each of the plurality of semiconductor chip regions CR of the first wafer WF1. The first semiconductor device 110, the wiring structure 120, a plurality of second internal connection pads 134, a second cover insulating layer 144, and the plurality of through-electrodes 150 may be located in each of the plurality of semiconductor chip regions CR of the second wafer WF2.

The first semiconductor substrate 100 may include a semiconductor (e.g., silicon (Si) or germanium (Ge)), or a compound semiconductor (e.g., silicon carbide (SiC), gallium arsenide (GaAs), indium arsenide (InAs), or indium phosphide (InP)). The first semiconductor substrate 100 may have an active surface and an inactive surface opposite to the active surface. For example, the first semiconductor device 110 and the wiring structure 120 may be located on the active surface of the first semiconductor substrate 100.

The first semiconductor device 110 may be, for example, a memory device. In some example embodiments, the first semiconductor device 110 may be a high bandwidth memory (HBM) dynamic-random access memory (DRAM) device. The first semiconductor devices 110 of the plurality of semiconductor chip regions CR of the first wafer WF1 and the second wafer WF2 may be semiconductor chips of the same type.

The wiring structure 120 may be electrically connected to the first semiconductor device 110 and/or the through-electrode 150. The wiring structure 120 may include at least one metal wiring layer and at least one via plug connected to the at least one metal wiring layer.

The first cover insulating layer 142 and the second cover insulating layer 144 may cover sidewalls of the plurality of first internal connection pads 132 and sidewalls of the plurality of second internal connection pads 134, respectively, and may not cover and may expose top surfaces of the plurality of first internal connection pads 132 and the plurality of second internal connection pads 134, respectively. The first cover insulating layer 142 and the second cover insulating layer 144 may cover the first semiconductor substrates 100 even in the scribe lane regions SL of the first wafer WF1 and in the scribe lane regions SL of the second wafer WF2. Each of the first cover insulating layer 142 and the second cover insulating layer 144 may be formed of SiO, SiN, SiCN, SiCO, or a polymer material. Examples of the polymer material may include benzocyclobutene (BCB), polyimide (PI), polybenzoxazole (PBO), silicone, acrylate, and epoxy.

In some example embodiments, after the plurality of first internal connection pads 132 and the plurality of second internal connection pads 134 are formed, the first cover insulating layer 142 and the second cover insulating layer 144 may be formed. In other example embodiments, after the first cover insulating layer 142 and the second cover insulating layer 144 having a plurality of holes corresponding to the plurality of first internal connection pads 132 and the plurality of second internal connection pads 134 are formed, the plurality of first internal connection pads 132 and the plurality of second internal connection pads 134 filling the plurality of holes may be formed. Each of the plurality of first internal connection pads 132 and the plurality of second internal connection pads 134 may be formed of a material including, for example, copper (Cu).

In some example embodiments, the top surfaces of the plurality of first internal connection pads 132, a top surface of the first cover insulating layer 142, the top surfaces of the plurality of second internal connection pads 134, and a top surface of the second cover insulating layer 144 may be on the same plane (e.g., may be coplanar). In other example embodiments, one of the first internal connection pad 132 or the second internal connection pad 134 may protrude from a corresponding one of the top surface of the first cover insulating layer 142 or the top surface of the second cover insulating layer 144, and the other one of the first internal connection pad 132 or the second internal connection pad 134 may be recessed from a corresponding one of the top surface of the first cover insulating layer 142 or the top surface of the second cover insulating layer 144. Widths of the plurality of first internal connection pads 132 and widths of the plurality of second internal connection pads 134 may be the same in some example embodiments, and may be different in other example embodiments.

The through-electrode 150 may have a first end connected to the wiring structure 120 and a second end extending into the first semiconductor substrate 100. The through-electrode 150 may have at least a part having a pillar shape. The through-electrode 150 may include a barrier film formed on a surface of the part having the pillar shape and a buried conductive layer filling the barrier film, and an insulating film may be located between the first semiconductor substrate 100 and the through-electrode 150.

Referring to FIG. 1B, the second wafer WF2 is attached to the first wafer WF1 so that the first cover insulating layer 142 and the second cover insulating layer 144 contact each other and the plurality of first internal connection pads 132 and the plurality of second internal connection pads 134 correspond to each other. The first cover insulating layer 142 and the second cover insulating layer 144 may be adhered to each other by applying heat and/or pressure in a process of attaching the second wafer WF2 to the first wafer WF1. For example, heat of a first temperature may be applied in the process of attaching the second wafer WF2 to the first wafer WF1.

Referring to FIGS. 1B and 1C, a plurality of device bonded pads 130 may be obtained by bonding the plurality of first internal connection pads 132 and the plurality of second internal connection pads 134 to correspond to each other by applying heat of a second temperature higher than the first temperature. The plurality of first internal connection pads 132 and corresponding ones of the plurality of second internal connection pads 134 may be expanded due to heat to contact each other, and then metal atoms may be diffused to be integrated, thereby forming the plurality of device bonded pads 130.

Referring to FIG. 1D, a portion of the first semiconductor substrate 100 of the second wafer WF2 is removed to expose the through-electrode 150 of the second wafer WF2. In some example embodiments, after a portion of an edge of the first semiconductor substrate 100 of the second wafer WF2 is removed, an upper portion of the first semiconductor substrate 100 of the second wafer WF2 may be removed to expose the through-electrode 150 of the second wafer WF2.

Figure 2:
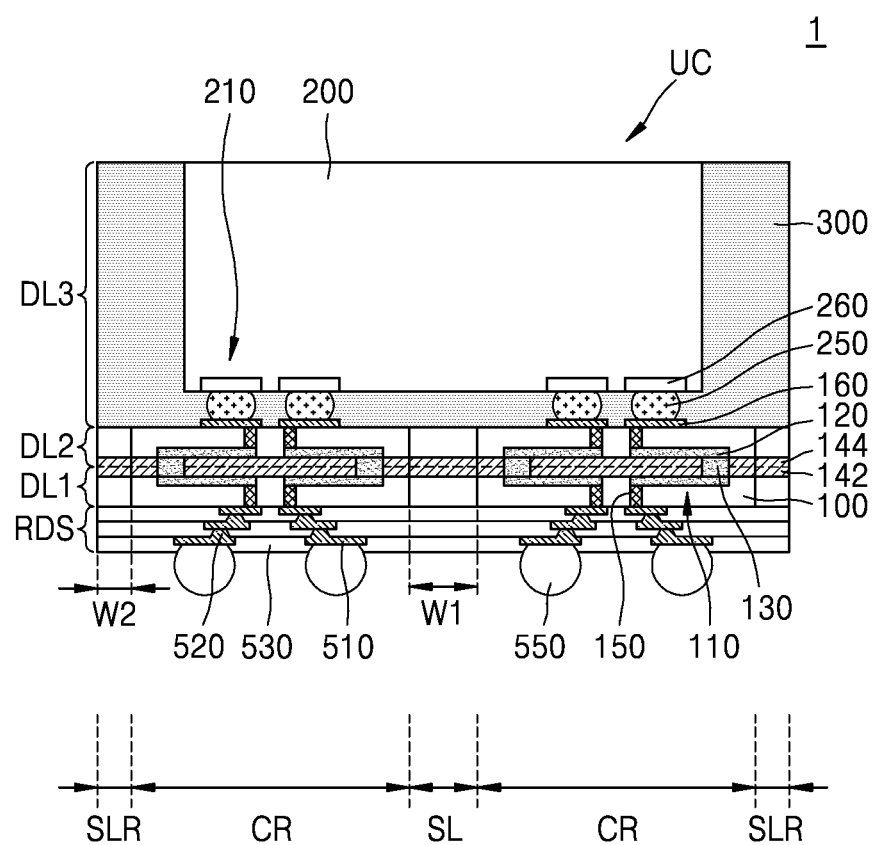
FIG. 2 is a cross-sectional view of the semiconductor package according to an example embodiment.

Referring to FIG. 1E, a plurality of upper connection pads 160 electrically connected to respective ones of the plurality of through-electrodes 150 are formed on the first semiconductor substrate 100 of the second wafer WF2. In some example embodiments, a protective insulating layer (not shown) that covers a top surface of the first semiconductor substrate 100 of the second wafer WF2, and exposes the plurality of upper connection pads 160 may be further formed. Although the plurality of upper connection pads 160 are directly connected to the plurality of through-electrodes 150 in FIG. 1E, example embodiments are not limited thereto. In some example embodiments, the plurality of upper connection pads 160 and the plurality of through-electrodes 150 may be electrically connected to each other through conductive rewiring patterns (not shown).

Figure 1F:
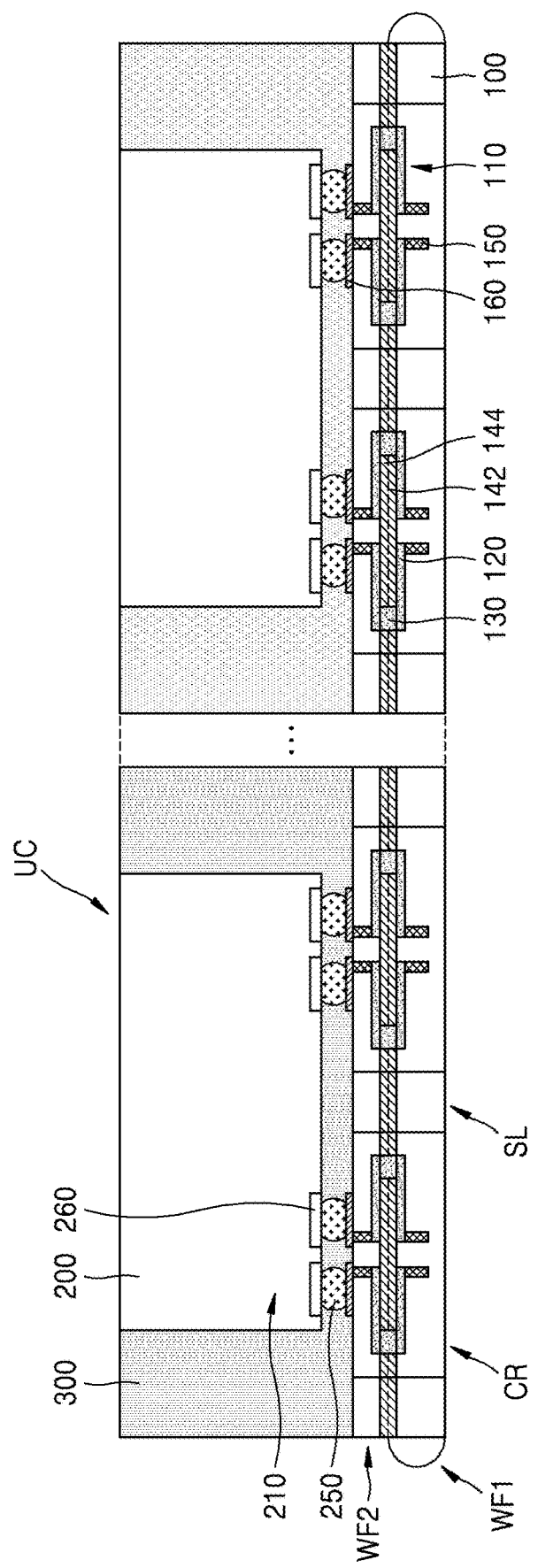

Referring to FIG. 1F, upper semiconductor chips UC each including a plurality of chip connection pads 260 electrically connected to the plurality of upper connection pads 160 are attached to the second wafer WF2. One upper semiconductor chip UC may be attached to the second wafer WF2 to correspond to at least two semiconductor chip regions CR of each of the first wafer WF1 and the second wafer WF2. That is, one upper semiconductor chip UC may correspond to at least four semiconductor chip regions CR of the first wafer WF1 and the second wafer WF2.

Each upper semiconductor chip UC may include a second semiconductor substrate 200, a second semiconductor device 210, and the plurality of chip connection pads 260. The second semiconductor substrate 200 may include a semiconductor or a compound semiconductor. The second semiconductor substrate 200 may have an active surface and an inactive surface opposite to the active surface. For example, the second semiconductor device 210 and the plurality of chip connection pads 260 may be located on the active surface of the second semiconductor substrate 200.

The second semiconductor device 210 may be, for example, a central processing unit (CPU) chip, a graphics processing unit (GPU) chip, or an application processor (AP) chip.

A plurality of chip connection terminals 250 may be located between the plurality of upper connection pads 160 and corresponding ones of the plurality of chip connection pads 260. The plurality of chip connection terminals 250 may be, for example, bumps or solder balls.

A molding member 300 surrounding the upper semiconductor chips UC is formed on the second wafer WF2. The molding member 300 may be formed of, for example, an epoxy molding compound (EMC). The molding member 300 may surround a top surface of the second wafer WF2 and a side surface of the upper semiconductor chip UC. In some example embodiments, the molding member 300 may not cover and may expose top surfaces of the upper semiconductor chips UC.

Figure 1G:
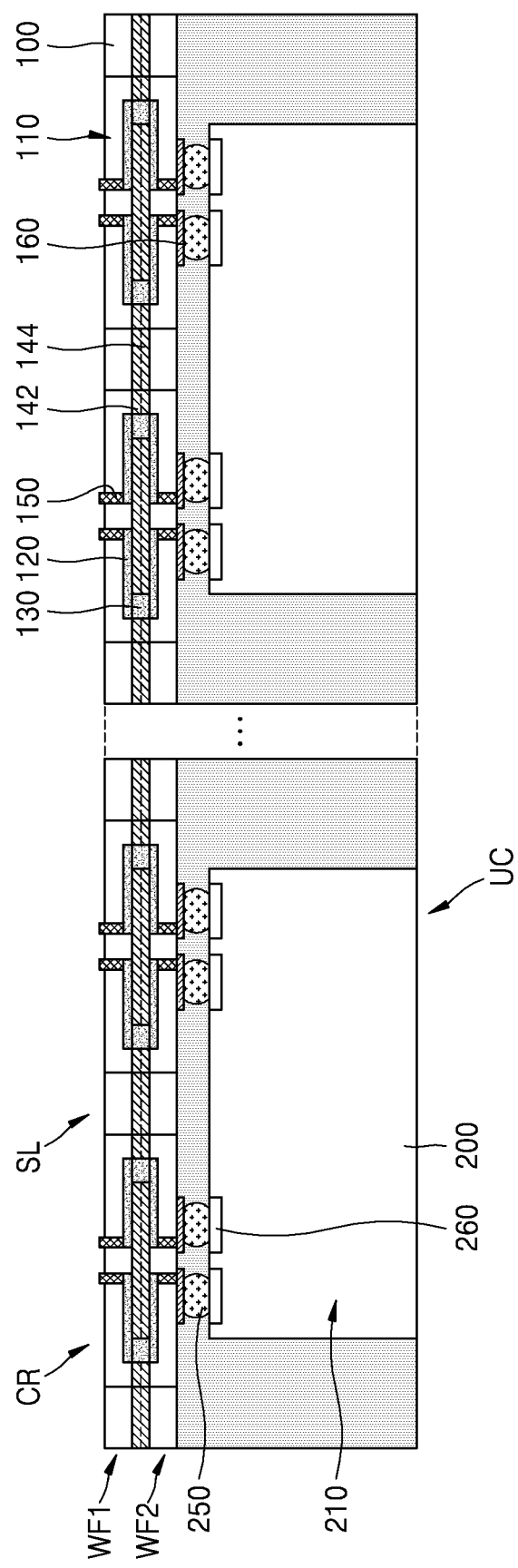

Referring to FIG. 1G, after a resultant structure of FIG. 1F is turned upside down (e.g., flipped) so that the first wafer WF1 is located over (e.g., above) the second wafer WF2, a portion of the first semiconductor substrate 100 of the first wafer WF1 is removed to expose the through-electrode 150 of the first wafer WF1. In some example embodiments, after a portion of an edge of the first semiconductor substrate 100 of the first wafer WF1 is removed, an upper portion of the first semiconductor substrate 100 may be removed to expose the through-electrode 150 of the first wafer WF1.

Figure 1H:
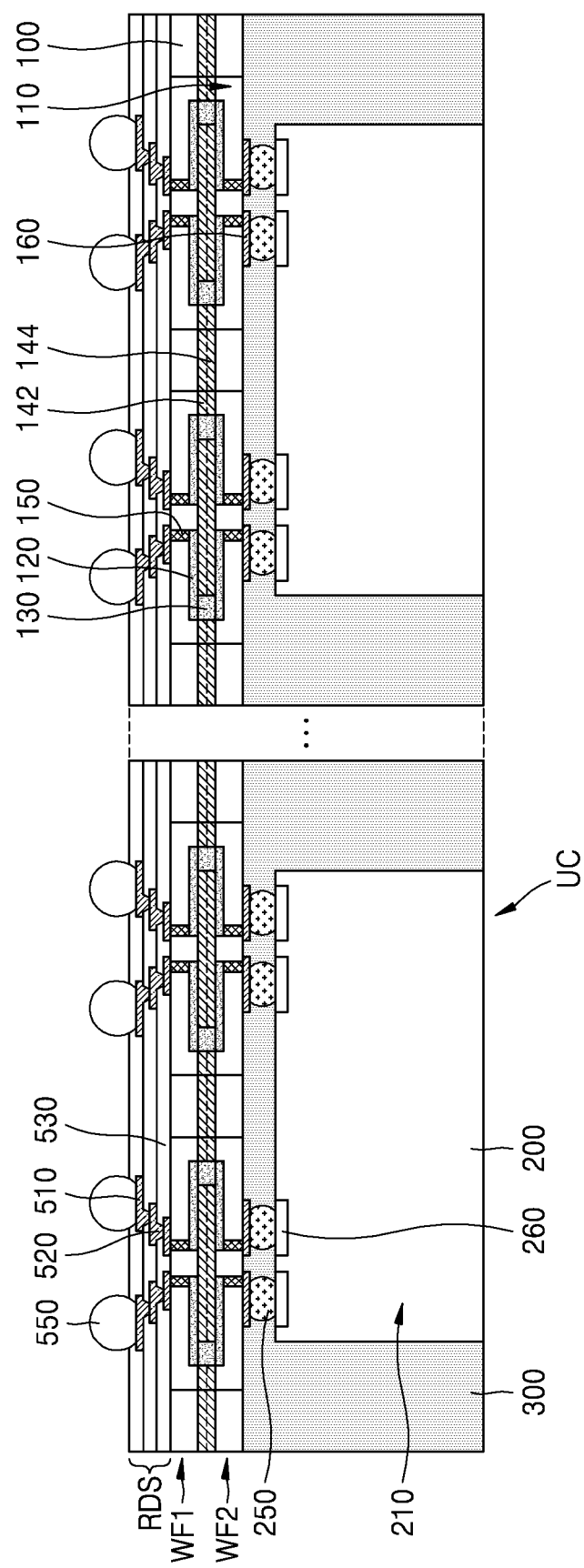

Referring to FIG. 1H, a rewiring structure RDS is formed on the first wafer WF1. The rewiring structure RDS may include a plurality of rewiring insulating layers 530, a plurality of rewiring conductive patterns 510 located on at least one of top surfaces and bottom surfaces) of the plurality of rewiring insulating layers 530, and a plurality of rewiring via patterns 520 each passing through at least one of the plurality of rewiring insulating layers 530 and connected to corresponding one or more of the plurality of rewiring conductive patterns 510. Each of the plurality of rewiring conductive patterns 510 and the plurality of rewiring via patterns 520 may include a seed layer contacting the rewiring insulating layer 530 and a conductive material layer on the seed layer.

Each of the plurality of rewiring conductive patterns 510 and the plurality of rewiring via patterns 520 may include, but is not limited to, metal, an alloy thereof, or a metal nitride. Each of the plurality of rewiring insulating layers 530 may include, for example, an organic compound. In some example embodiments, each of the plurality of rewiring insulating layers 530 may include an organic polymer material (e.g., photosensitive polyimide (PSPI)).

The rewiring conductive patterns 510 and the rewiring via patterns 520 may be electrically connected to the through-electrodes 150 of the first wafer WF1. A plurality of external connection terminals 550 contacting the rewiring conductive patterns 510 and electrically connected to the plurality of through-electrodes 150 of the first wafer WF1 may be attached to the rewiring structure RDS.

In some example embodiments, before the rewiring structure RDS is formed, a plurality of lower connection pads (not shown) electrically connected to the plurality of through-electrodes 150 and/or a protective insulating layer (not shown) covering a top surface of the first semiconductor substrate 100 and exposing the plurality of lower connection pads may be formed on the first semiconductor substrate 100 of the first wafer WF1. The plurality of lower connection pads may be formed in the same or substantially similar manner to that used to form the plurality of upper connection pads 160. In other example embodiments, when some of the plurality of rewiring conductive patterns 510 and some of the plurality of rewiring insulating layers 530 perform functions of the plurality of lower connection pads and the protective insulating layer, and thus the plurality of lower connection pads and the protective insulating layer may not be additionally formed.

Figure 1I:
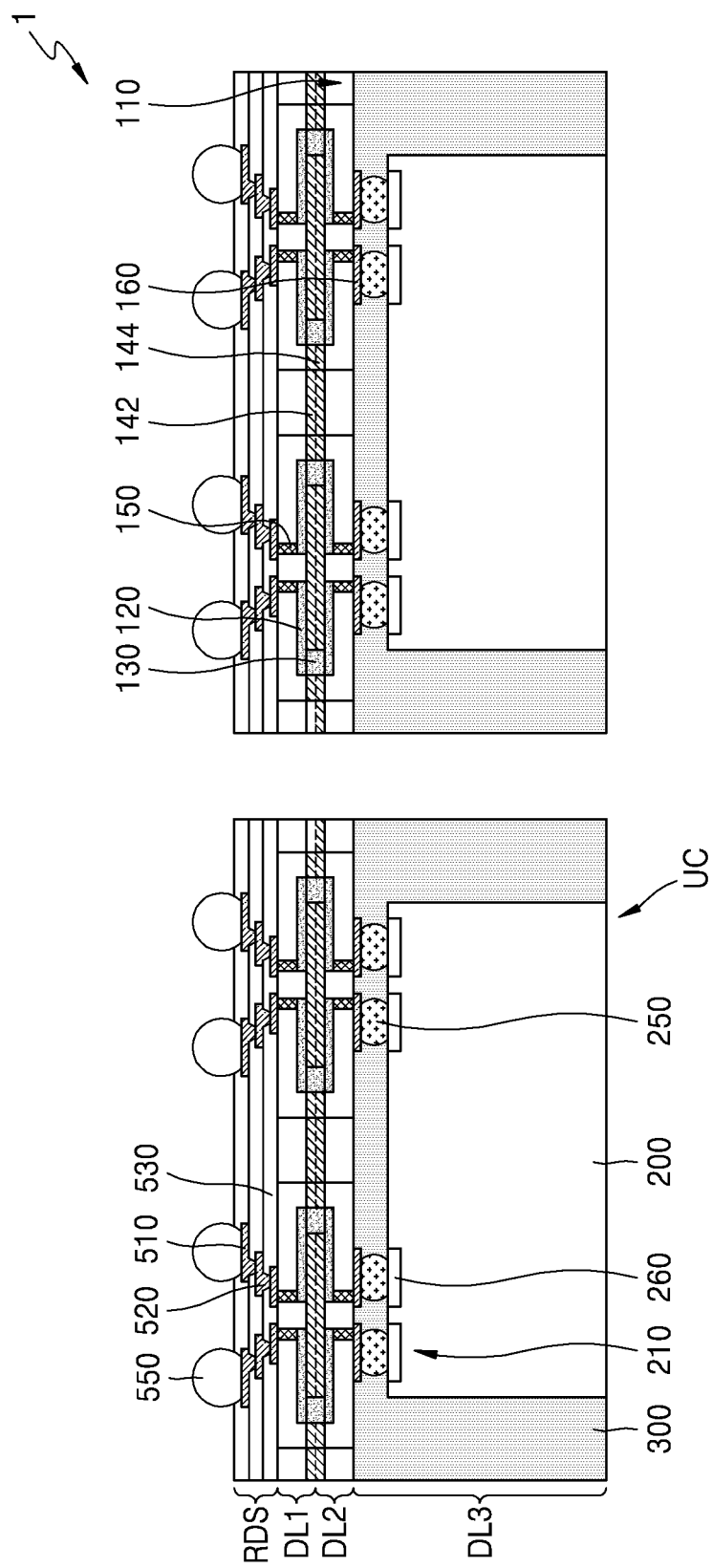

Referring to FIGS. 1H and 1I, a plurality of the semiconductor packages 1 that are separated from one another are formed by cutting the rewiring structure RDS, the first wafer WF1, the second wafer WF2, and the molding member 300 along the scribe lane regions SL that do not vertically overlap the upper semiconductor chips UC. In each semiconductor package 1, the rewiring structure RDS, a first device layer DL1 that is a portion of the first wafer WF1 separated by the cutting to have at least two semiconductor chip regions CR, a second device layer DL2 that is a portion of the second wafer WF2 separated by the cutting to have at least two semiconductor chip regions CR, and a third device layer DL3 including the upper semiconductor chip UC may be sequentially stacked.

Referring to FIG. 2, in the semiconductor package 1, the rewiring structure RDS, the first device layer DL1 including at least two semiconductor chip regions CR, the second device layer DL2 including at least two semiconductor chip regions CR, and the third device layer DL3 including the upper semiconductor chip UC may be sequentially stacked. The at least two semiconductor chip regions CR of the first device layer DL1 and corresponding ones of the at least two semiconductor chip regions CR of the second device layer DL2 may vertically overlap each other.

The first device layer DL1 may include the first semiconductor substrate 100, the first semiconductor device 110, the wiring structure 120, the plurality of through-electrodes 150 passing through the first semiconductor substrate 100, and the first cover insulating layer 142. The second device layer DL2 may include the first semiconductor substrate 100, the first semiconductor device 110, the wiring structure 120, the plurality of through-electrodes 150 passing through the first semiconductor substrate 100, and the second cover insulating layer 144. The second device layer DL2 may be located on the first device layer DL1 so that the first cover insulating layer 142 and the second cover insulating layer 144 contact each other. The device bonded pads 130 may pass through the first cover insulating layer 142 and the second cover insulating layer 144, and may electrically connect the wiring structure 120 of the first device layer DL1 to the wiring structure 120 of the second device layer DL2. Accordingly, the device bonded pads 130 may electrically connect the through-electrodes 150 of the first device layer DL1 to the through-electrodes 150 of the second device layer DL2. The plurality of upper connection pads 160 electrically connected to the plurality of through-electrodes 150 of the second device layer DL2, respectively, may be located on the second device layer DL2. At least some of the plurality of through-electrodes 150 of each of the first device layer DL1 and the second device layer DL2 may be electrically connected to the first semiconductor device 110 of each of the first device layer DL1 and the second device layer DL2. In some example embodiments, at least some of the plurality of through-electrodes 150 of each of the first device layer DL1 and the second device layer DL2 may be used only for electrical connection with the second semiconductor device 210.

Each of the first device layer DL1 and the second device layer DL2 may include the scribe lane region SL that separates at least two semiconductor chip regions CR in each of which the first semiconductor device 110 is located, and may include residual scribe lane regions SLR surrounding the at least two semiconductor chip regions CR at edges of each of the first device layer DL1 and the second device layer DL2.

In a process of forming the plurality of semiconductor packages 1 that are separated from one another by cutting the rewiring structure RDS, the first wafer WF1, the second wafer WF2, and the molding member 300 as described with reference to FIGS. 1H and 1I, the residual scribe lane regions SLR refer to portions of the scribe lane regions SL remaining after the cutting.

For example, when a wafer is cut along scribe lane regions into a plurality of semiconductor chips that are separated from one another, only portions of the scribe lane regions may remain along edges of each semiconductor chip as the residual scribe lane regions SLR.

However, in the semiconductor package 1 according to the example embodiment, because each of the first device layer DL1 and the second device layer DL2 includes at least two semiconductor chip regions CR, the scribe lane region SL that is not cut may be located between the at least two semiconductor chip regions CR, and the residual scribe lane regions SLR that are cut may be located at edges of each of the first device layer DL1 and the second device layer DL2. A first width W1 that is a width of the scribe lane region SL of each of the first device layer DL1 and the second device layer DL2 may be greater than a second width W2 that is a width of each of the residual scribe lane regions SLR that are cut. In some example embodiments, the first width W1 may be more than two times greater than the second width W2.

The rewiring structure RDS may include the plurality of rewiring insulating layers 530, the plurality of rewiring conductive patterns 510 located on at least one of the top surfaces and the bottom surfaces of the plurality of rewiring insulating layers 530, and the plurality of rewiring via patterns 520 each passing through at least one of the plurality of rewiring insulating layers 530 and connected to corresponding one or more of the plurality of rewiring conductive patterns 510. The rewiring conductive patterns 510 and the rewiring via patterns 520 may be electrically connected to the through-electrodes 150 of the first device layer DL1. The external connection terminals 550 electrically connected to the rewiring conductive patterns 510 may be attached to the rewiring structure RDS facing the first device layer DL1. The external connection terminals 550 may be attached to a bottom surface of the rewiring structure RDS, and the first device layer DL1 may be located on a top surface of the rewiring structure RDS.

The third device layer DL3 includes the upper semiconductor chip UC including the plurality of chip connection pads 260 electrically connected to the plurality of upper connection pads 160. The upper semiconductor chip UC may vertically overlap at least two semiconductor chip regions CR of the first device layer DL1 and the second device layer DL2. That is, the upper semiconductor chip UC may correspond to at least four semiconductor chip regions CR of the first device layer DL1 and the second device layer LD2. The plurality of chip connection terminals 250 may be located between the plurality of upper connection pads 160 and corresponding ones of the plurality of chip connection pads 260.

The molding member 300 surrounding the upper semiconductor chip UC may be located on the second device layer DL2. The molding member 300 may surround a top surface of the second device layer DL2 and a side surface of the upper semiconductor chip UC. In some example embodiments, the molding member 300 may not cover, and may expose a top surface of the upper semiconductor chip UC. In some example embodiments, a top surface of the molding member 300 and the top surface of the upper semiconductor chip UC may be on the same plane (e.g., may be coplanar).

In some example embodiments, a heat dissipation member (not shown) may be attached to the top surface of the upper semiconductor chip UC. A thermal interface material (TIM) layer may be located between the top surface of the upper semiconductor chip UC and the heat dissipation member. In some example embodiments, an electromagnetic interference (EMI) shield layer (not shown) may be formed on a side surface and a top surface of the semiconductor package 1.

In the semiconductor package 1 according to the example embodiment of the inventive concepts, the active surfaces of the first semiconductor substrates 100 of the first device layer DL1 and the second device layer DL2 are adhered to each other through face-to-face bonding, and the third device layer DL3 including the upper semiconductor chip UC is located on the first device layer DL1 and the second device layer DL2. Also, in each of the first device layer DL1 and the second device layer DL2, at least two semiconductor chip regions CR each including the first semiconductor device 110 may be horizontally located, and the upper semiconductor chip UC including the second semiconductor device 210 that is different from the first semiconductor device 110 may be located over the at least two semiconductor chip regions CR of each of the first device layer DL1 and the second device layer DL2.

In the semiconductor package 1 according to the example embodiment of the inventive concepts, because the upper semiconductor chip UC is attached to the second device layer DL2 that has a larger area than the upper semiconductor chip UC, a relatively fine pitch may be achieved without using an additional interposer, thereby reducing semiconductor package manufacturing costs. Also, in the semiconductor package 1 according to the example embodiment of the inventive concepts, because the rewiring structure RDS to which the external connection terminals 550 are connected is formed on the first device layer DL1 that has a larger area than the upper semiconductor chip UC, an additional printed circuit board may not be used, thereby achieving a relatively small form factor.

In the present disclosure, the semiconductor chip region CR, the scribe lane region SL, the first semiconductor substrate 100, the first semiconductor device 110, and the through-electrode 150 of the first device layer DL1 may be referred to as a first semiconductor chip region, a first scribe lane region, a first semiconductor substrate, a first semiconductor device, and a first through-electrode, respectively. The semiconductor chip region CR, the scribe lane region SL, the first semiconductor substrate 100, the first semiconductor device 110, and the through-electrode 150 of the second device layer DL2 may be referred to as a second semiconductor chip region, a second scribe lane region, a second semiconductor substrate, a second semiconductor device, and a second through-electrode, respectively. The second semiconductor substrate 200 and the second semiconductor device 210 of the third device layer DL3 may be referred to as a third semiconductor substrate and a third semiconductor device, respectively.

Figure 3A:
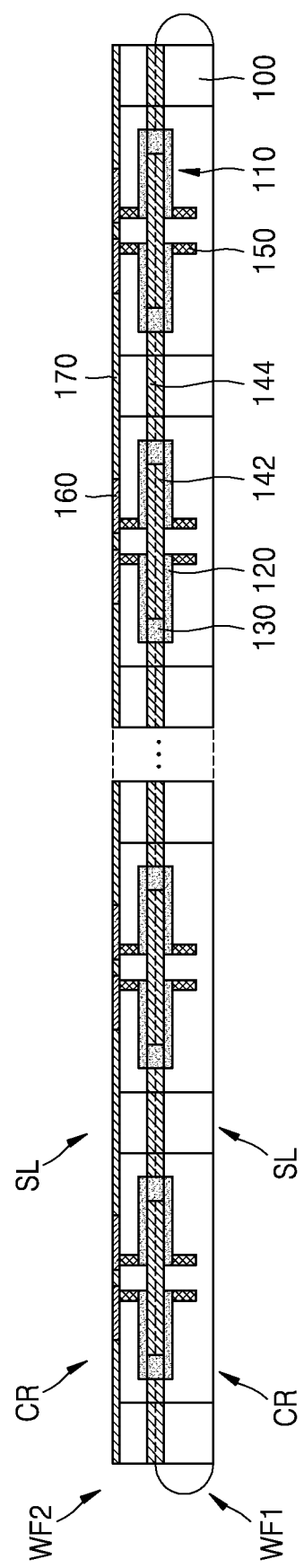
FIGS. 3A through 3C are cross-sectional views sequentially illustrating a method of manufacturing a semiconductor package according to an example embodiment.
Figure 3B:
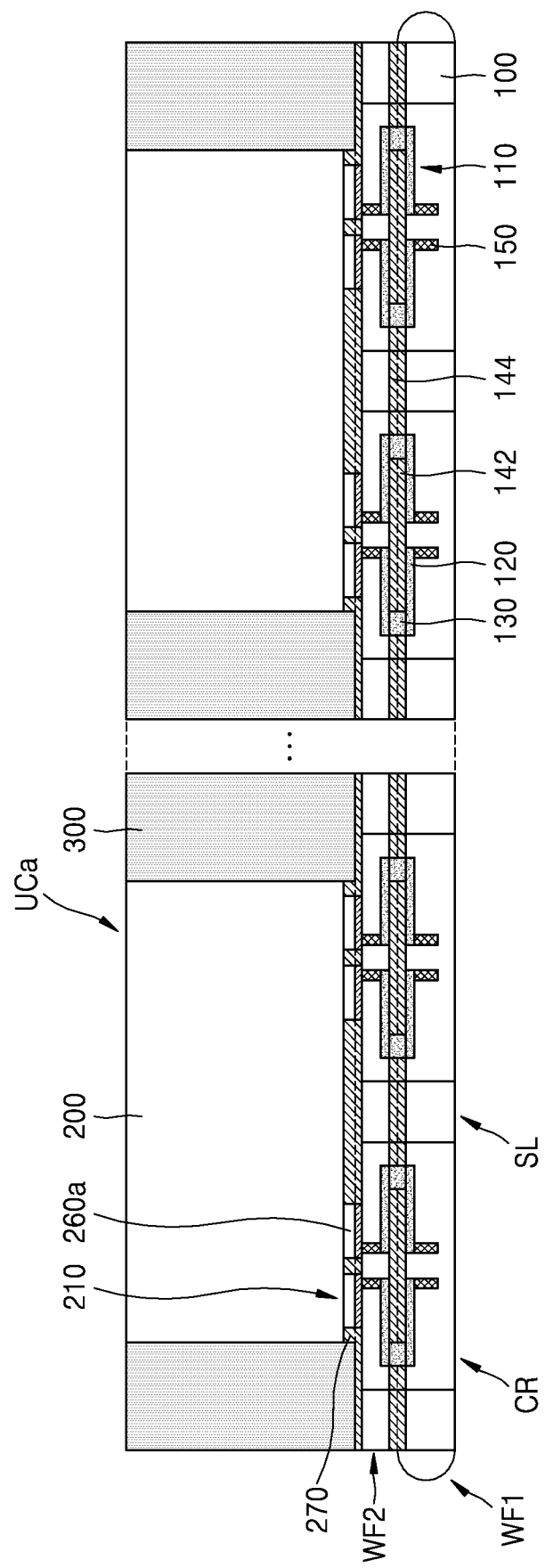
Figure 3C:
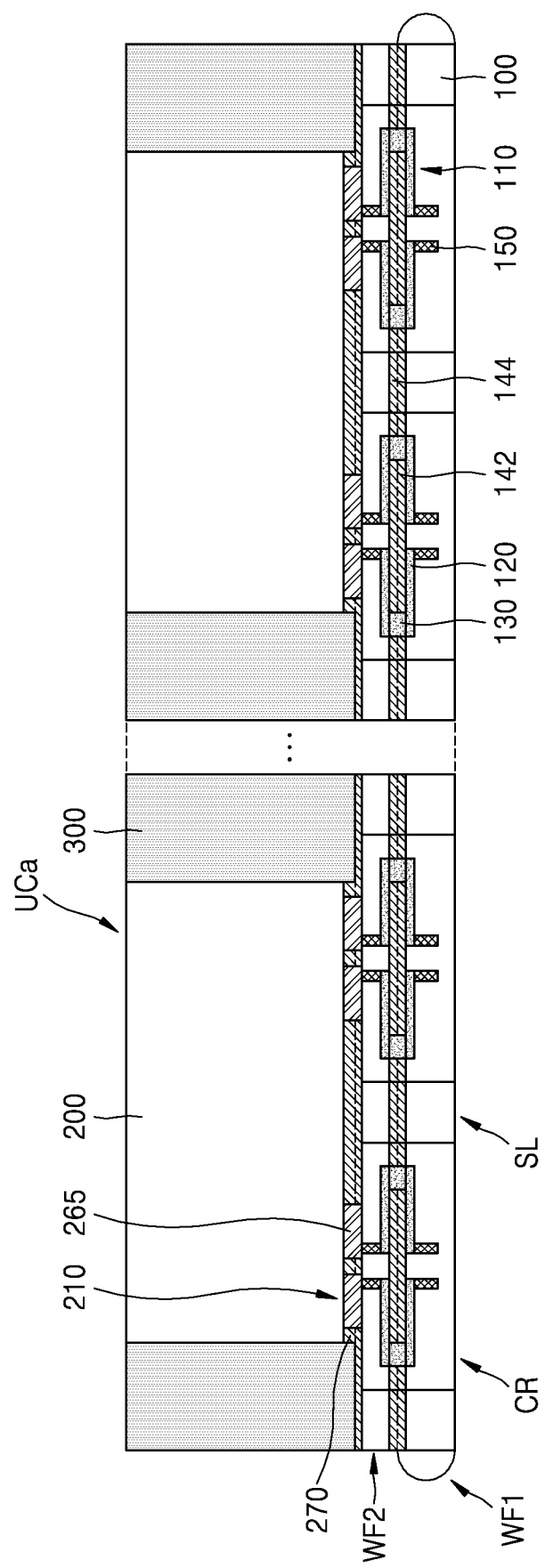
Figure 4:
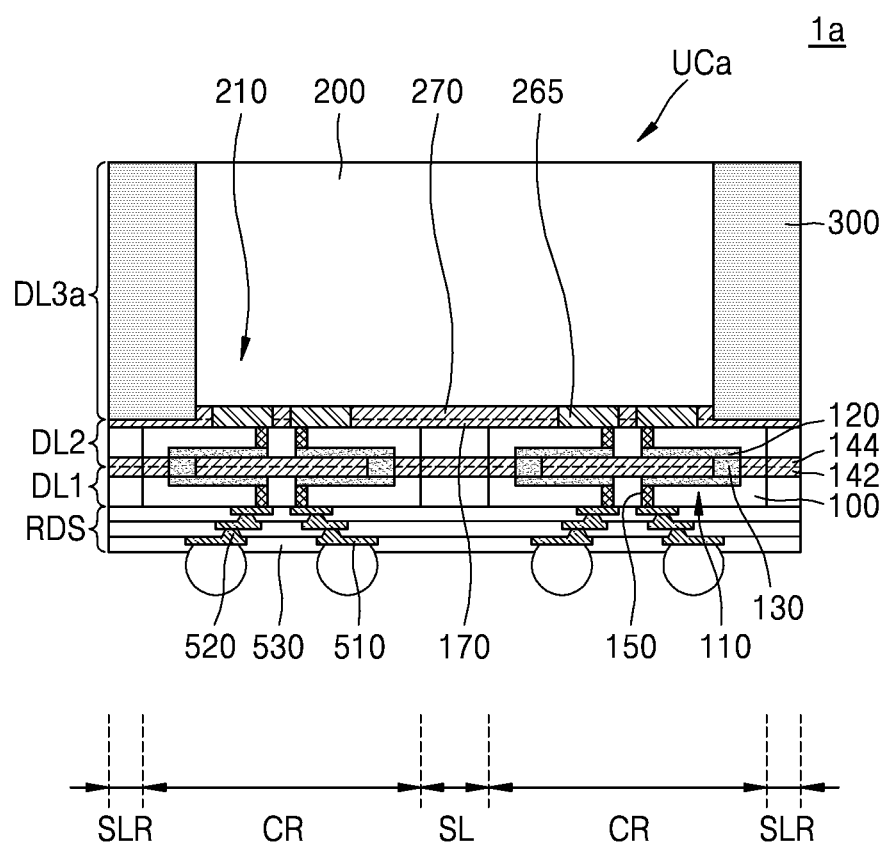
FIG. 4 is a cross-sectional view of the semiconductor package formed by the method illustrated in FIGS. 3A through 3C, according to an example embodiment.

FIGS. 3A through 3C are cross-sectional views sequentially illustrating a method of manufacturing a semiconductor package according to an example embodiment. FIG. 4 is a cross-sectional view of the semiconductor package, formed by the method illustrated in FIGS. 3A through 3C, according to an example embodiment, and the same description as that made with reference to FIGS. 1A through 2 will not be given. In detail, FIG. 3A illustrates a step after FIG. 1D.

Referring to FIG. 3A, the plurality of upper connection pads 160 electrically connected to the plurality of through-electrodes 150, respectively, and a third cover insulating layer 170 covering sidewalls of the plurality of upper connection pads 160 and not covering top surfaces of the plurality of upper connection pads 160 are formed on the first semiconductor substrate 100 of the second wafer WF2. The plurality of upper connection pads 160 and the third cover insulating layer 170 may be formed by using the same or substantially similar method to that used to form the first internal connection pads 132 and the first cover insulating layer 142, or the plurality of second internal connection pads 134 and the second cover insulating layer 144.

Referring to FIG. 3B, an upper semiconductor chip UCa including a plurality of chip connection pads 260a is attached to the second wafer WF2. The upper semiconductor chip UCa may be attached to the second wafer WF2 so that the plurality of chip connection pads 260a correspond to the plurality of upper connection pads 160. The upper semiconductor chip UCa may include the second semiconductor substrate 200, the second semiconductor device 210, the plurality of chip connection pads 260a, and a chip cover insulating layer 270. The chip cover insulating layer 270 may cover sidewalls of the plurality of chip connection pads 260a, and may not cover top surfaces of the plurality of chip connection pads 260a on the second semiconductor substrate 200.

The third cover insulating layer 170 and the chip cover insulating layer 270 may be adhered to each other by applying heat and/or pressure in a process of attaching the upper semiconductor chip UCa to the second wafer WF2. For example, heat of a third temperature may be applied in the process of attaching the upper semiconductor chip UCa to the second wafer WF2. The molding member 300 surrounding the upper semiconductor chip UCa is formed on the second wafer WF2.

Referring to FIGS. 3B and 3C, a plurality of chip bonded pads 265 obtained by bonding the plurality of upper connection pads 160 with corresponding ones of the plurality of chip connection pads 260a are formed by applying heat of a fourth temperature higher than the third temperature. The plurality of upper connection pads 160 and corresponding ones of the plurality of chip connection pads 260a may be expanded due to heat to contact each other, and then metal atoms from the plurality of upper connection pads 160 and the corresponding ones of the plurality of chip connection pads 260a are diffused to be integrated, thereby forming the plurality of chip bonded pads 265.

Referring to FIG. 4, a semiconductor package 1a is formed by performing the above process of FIGS. 1G through 1I on a resultant structure of FIG. 3C. In the semiconductor package 1a, the rewiring structure RDS, the first device layer DL1 including at least two semiconductor chip regions CR, the second device layer DL2 including at least two semiconductor chip regions CR, and a third device layer DL3a including the upper semiconductor chip UCa may be sequentially stacked.

The third device layer DL3a may be located on the second device layer DL2 so that the third cover insulating layer 170 and the chip cover insulating layer 270 contact each other. The chip bonded pads 265 may pass through the third cover insulating layer 170 and the chip cover insulating layer 270, and may electrically connect the through-electrodes 150 of the second device layer DL2 to the second semiconductor device 210 of the upper semiconductor chip UCa.

Figure 6:
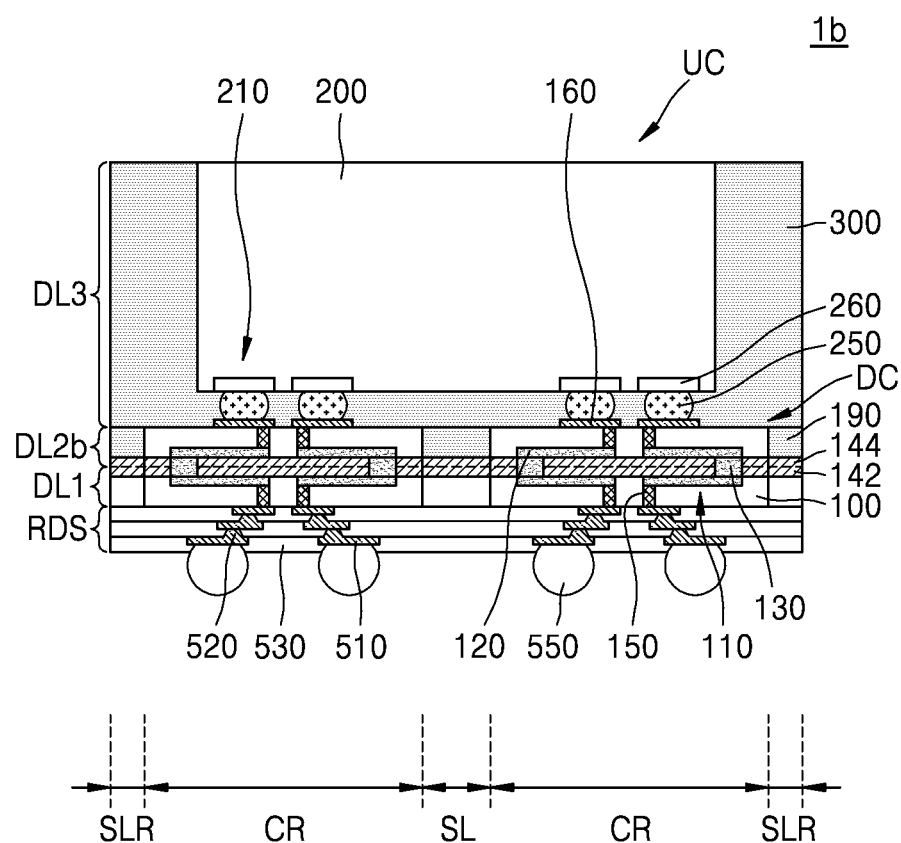
FIG. 6 is a cross-sectional view of the semiconductor package formed by the method illustrated in FIGS. 5A through 5D, according to an example embodiment.

FIGS. 5A through 5D are cross-sectional views sequentially illustrating a method of manufacturing a semiconductor package according to an example embodiment. FIG. 6 is a cross-sectional view of the semiconductor package formed by the method illustrated in FIGS. 5A through 5D, according to an example embodiment, and thus the same description as that made with reference to FIGS. 1A through 2 will not be given. In detail, FIG. 5A illustrates a step after FIG. 1A.

Referring to FIGS. 1A and 5A, the second wafer WF2 may be cut along the scribe lane regions SL to separate the plurality of semiconductor chip regions CR into a plurality of lower semiconductor chips DC. Although the lower semiconductor chips DC do not include the scribe lane regions SL in FIG. 5A, example embodiments are not limited thereto, and the lower semiconductor chips DC may further include portions of the scribe lane regions SL, like the residual scribe lane regions SLR of FIG. 2.

The plurality of lower semiconductor chips DC are attached to the first wafer WF1 to correspond to the plurality of semiconductor chip regions CR of the first wafer WF1, respectively. Each of the lower semiconductor chips DC may include the first semiconductor substrate 100, the first semiconductor device 110, the wiring structure 120, the plurality of first internal connection pads 132, the first cover insulating layer 142, and the plurality of through-electrodes 150.

The plurality of lower semiconductor chips DC may be attached to the first wafer WF1 so that the first cover insulating layer 142 and the second cover insulating layer 144 contact each other and the plurality of first internal connection pads 132 and the plurality of second internal connection pads 134 correspond to each other. The first cover insulating layer 142 and the second cover insulating layer 144 may be adhered to each other by applying heat and/or pressure in a process of attaching the plurality of lower semiconductor chips DC to the first wafer WF1.

Referring to FIGS. 5A and 5B, the plurality of device bonded pads 130 obtained by bonding the plurality of first internal connection pads 132 and corresponding ones of the plurality of second internal connection pads 134 are formed.

Referring to FIG. 5C, a filling molding member 190 filling spaces between the plurality of lower semiconductor chips DC and covering the plurality of lower semiconductor chips DC is formed on the first wafer WF1. The filling molding member 190 may include, for example, an EMC.

Referring to FIG. 5D, a portion of the first semiconductor substrate 100 of the second wafer WF2 and a portion of the filling molding member 190 are removed in the plurality of lower semiconductor chips DC to expose the through-electrodes 150 of the plurality of lower semiconductor chips DC.

Referring to FIG. 6, a semiconductor package 1b is formed by performing the above process of FIGS. 1E through 1I on a resultant structure of FIG. 5D. In the semiconductor package 1b, the rewiring structure RDS, the first device layer DL1 including at least two semiconductor chip regions CR that are spaced apart from each other with the scribe lane region SL, a second device layer DL2b including at least two lower semiconductor chips DC that are spaced apart from each other with the filling molding member 190 therebetween, and the third device layer DL3 including the upper semiconductor chip UC may be sequentially stacked.

Unlike the semiconductor package 1 of FIG. 2 that forms the second device layer DL2 on the first device layer DL1 by using a wafer-to-wafer (W2W) bonding method, the semiconductor package 1b of FIG. 6 may form the second device layer DL2b on the first device layer DL1 by using a chip-to-wafer/die-to-wafer (C2W/D2W) bonding method.

Figure 7A:
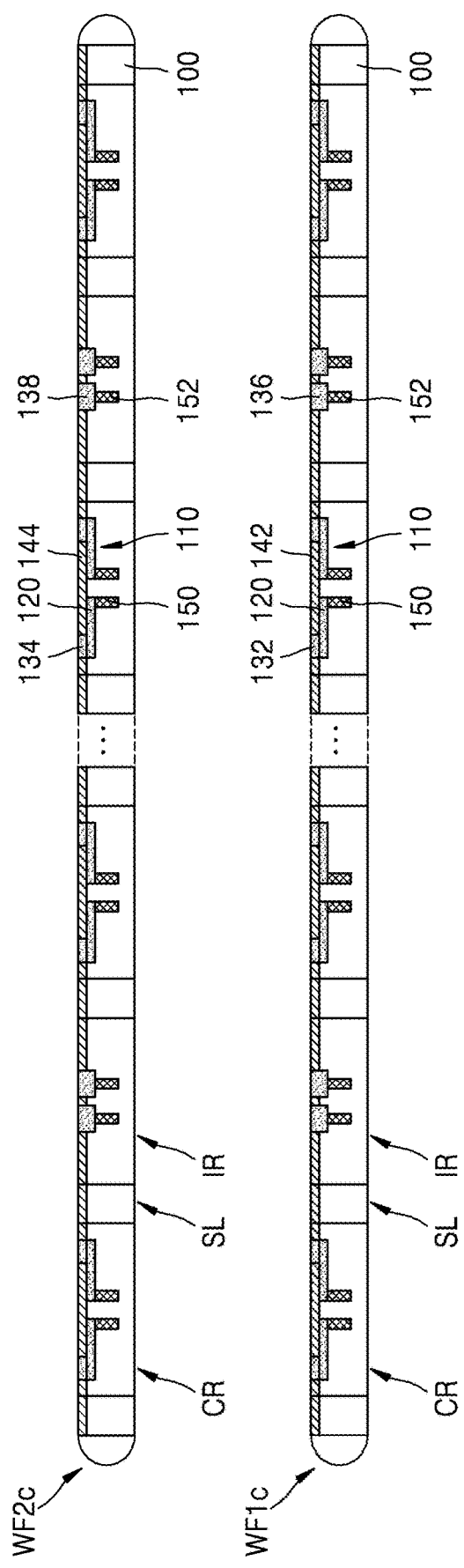
FIGS. 7A through 7C are cross-sectional views sequentially illustrating a method of manufacturing a semiconductor package according to an example embodiment.
Figure 7B:
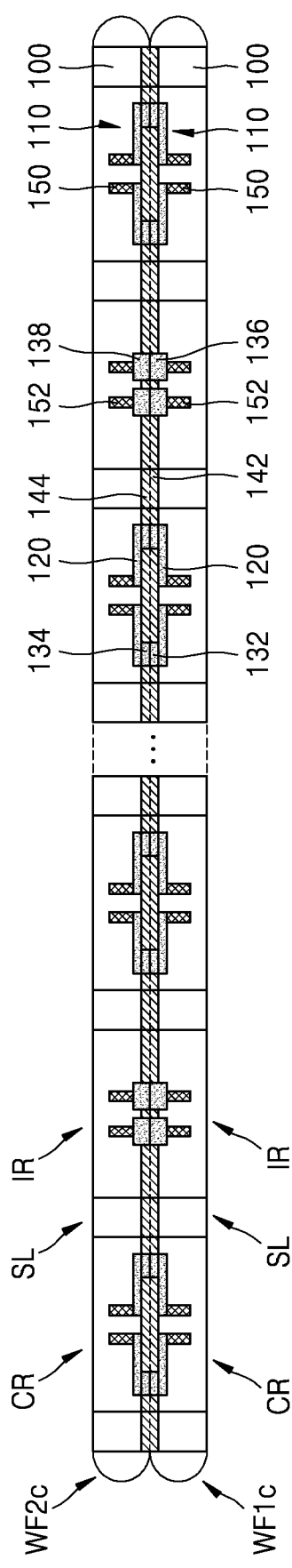
Figure 7C:
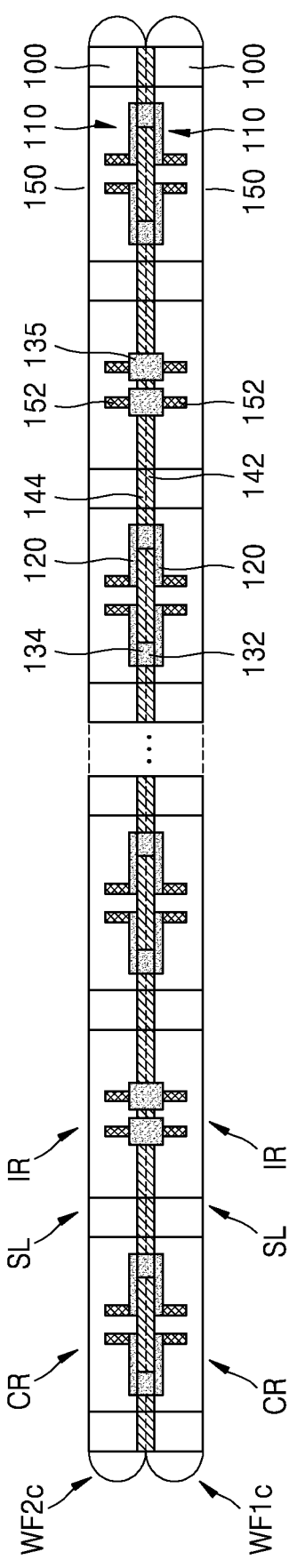
Figure 8:
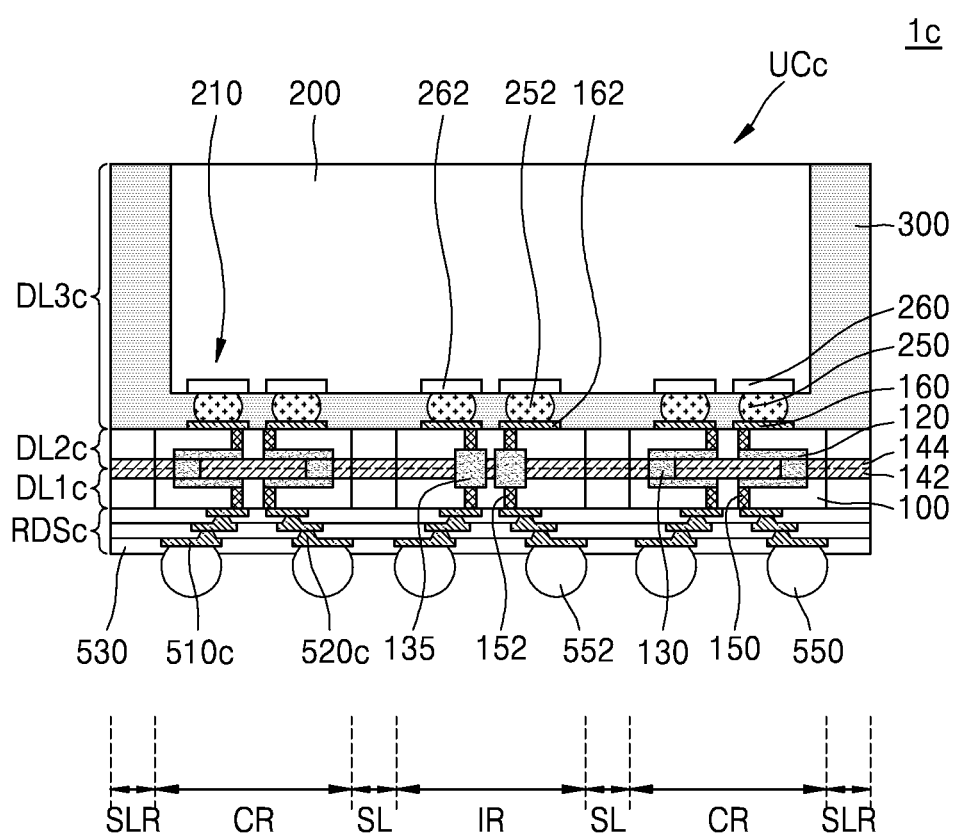
FIG. 8 is a cross-sectional view of the semiconductor package formed by the method illustrated in FIGS. 7A through 7C, according to an example embodiment.

FIGS. 7A through 7C are cross-sectional views sequentially illustrating a method of manufacturing a semiconductor package according to an example embodiment. FIG. 8 is a cross-sectional view of the semiconductor package formed by the method illustrated in FIGS. 7A through 7C, according to an example embodiment, and thus the same description as that made with reference to FIGS. 1A through 2 will not be given.

Referring to FIG. 7A, a first wafer WF1c and a second wafer WF2c are prepared. Each of the first wafer WF1c and the second wafer WF2c may include the plurality of semiconductor chip regions CR and a plurality of interposer regions IR that are spaced apart from each other by the scribe lane regions SL. In each of the first wafer WF1c and the second wafer WF2c, the plurality of interposer regions IR, instead of some of the plurality of semiconductor chip regions CR of each of the first wafer WF1 and the second wafer WF2 of FIG. 1A are located, and the description will focus on the plurality of interposer regions IR. The number of the plurality of semiconductor chip regions CR of each of the first wafer WF1c and the second wafer WF2c may be less than the number of the plurality of semiconductor chip regions CR of each of the first wafer WF1 and the second wafer WF2 of FIG. 1A.

A size (area) of each of the interposer regions IR may be the same as a size (an area) of each of the semiconductor chip regions CR in some example embodiments, and may be less than a size (area) of the semiconductor chip region CR in other example embodiments. Accordingly, a sum of the number of the plurality of semiconductor chip regions CR and the number of the plurality of interposer regions IR of each of the first wafer WF1c and the second wafer WF2c may be the same as the total number of the plurality of semiconductor chip regions CR of each of the first wafer WF1 and the second wafer WF2 of FIG. 1A in some example embodiments, and may be greater than the total number of the plurality of semiconductor chip regions CR of each of the first wafer WF1 and the second wafer WF2 of FIG. 1A in other example embodiments.

Each of the interposer regions IR of the first wafer WF1c includes a plurality of first additional connection pads 136 and a plurality of additional through-electrodes 152 connected to the plurality of first additional connection pads 136, and each of the interposer regions IR of the second wafer WF2c includes a plurality of second additional connection pads 138 and the plurality of additional through-electrodes 152 connected to the plurality of second additional connection pads 138. The first cover insulating layer 142 and the second cover insulating layer 144 may cover sidewalls of the plurality of first additional connection pads 136 and the plurality of second additional connection pads 138, and may not cover and may expose top surfaces of the plurality of first additional connection pads 136 and the plurality of second additional connection pads 138 in the interposer regions IR of the first wafer WF1 and the second wafer WF2.

Although the first additional connection pads 136 and the second additional connection pads 138 are thicker than the first internal connection pads 132 and the second internal connection pads 134 in FIG. 7A for convenience of explanation, example embodiments are not limited thereto. For example, thicknesses of the first additional connection pads 136 and the second additional connection pads 138 may be the same as thicknesses of the first internal connection pads 132 and the second internal connection pads 134. The wiring structures 120 may be located between the first additional connection pads 136 and the additional through-electrodes 152 and between the second additional connection pads 138 and the additional through-electrodes 152.

Referring to FIG. 7B, the second wafer WF2c is attached to the first wafer WF1c so that the first cover insulating layer 142 and the second cover insulating layer 144 contact each other, the plurality of first internal connection pads 132 and the plurality of second internal connection pads 134 correspond to each other, and the plurality of first additional connection pads 136 and the plurality of second additional connection pads 138 correspond to each other.

Referring to FIGS. 7B and 7C, the plurality of device bonded pads 130 obtained by bonding the plurality of first internal connection pads 132 and corresponding ones of the plurality of second internal connection pads 134, and a plurality of additional bonded pads 135 obtained by bonding the plurality of first additional connection pads 136 and corresponding ones of the plurality of second additional connection pads 138 to form an integral structure through diffusion bonding are formed.

Referring to FIG. 8, a semiconductor package 1c is formed by performing a process the same or substantially similar to the above process of FIGS. 1D through 1I on a resultant structure of FIG. 7C. In the semiconductor package 1c, a rewiring structure RDSc, a first device layer DL1c including at least two semiconductor chip regions CR and at least one interposer region IR, a second device layer DL2c including at least two semiconductor chip regions CR and at least one interposer region IR, and a third device layer DL3c including an upper semiconductor chip UCc may be sequentially stacked.

The first device layer DL1c may include the first semiconductor substrate 100 including at least two semiconductor chip regions CR and at least one interposer region IR, the wiring structure 120, the first cover insulating layer 142, the first semiconductor device 110 and the plurality of through-electrodes 150 of the semiconductor chip region CR, and a plurality of additional through-electrodes 152 of the interposer region IR, the second device layer DL2c may include the first semiconductor substrate 100 including at least two semiconductor chip regions CR and at least one interposer region IR, the wiring structure 120, the second cover insulating layer 144, the first semiconductor device 110 and the plurality of through-electrodes 150 of the semiconductor chip region CR, and the plurality of additional through-electrodes 152 of the interposer region IR, and the second device layer DL2c may be located on the first device layer DL1c so that the first cover insulating layer 142 and the second cover insulating layer 144 contact each other. The device bonded pads 130 may pass through the first cover insulating layer 142 and the second cover insulating layer 144 in the semiconductor chip region CR and may electrically connect the through-electrodes 150 of the first device layer DL1c to the through-electrodes 150 of the second device layer DL2c. The additional bonded pads 135 may pass through the first cover insulating layer 142 and the second cover insulating layer 144 in the interposer region IR, and may electrically connect the additional through-electrodes 152 of the first device layer DL1c to the additional through-electrodes 152 of the second device layer DL2c.

The plurality of upper connection pads 160 electrically connected to the plurality of through-electrodes 150 and a plurality of additional upper connection pads 162 electrically connected to the plurality of additional through-electrodes 152 may be located on the second device layer DL2c.

The upper semiconductor chip UCc may include the second semiconductor substrate 200, the second semiconductor device 210, the plurality of chip connection pads 260, and a plurality of additional chip connection pads 262. The plurality of chip connection terminals 250 may be located between the plurality of upper connection pads 160 and the plurality of chip connection pads 260 corresponding to each other, and a plurality of additional chip connection terminals 252 may be located between the plurality of additional upper connection pads 162 and the plurality of additional chip connection pads 262 corresponding to each other.

The rewiring structure RDSc may include the plurality of rewiring insulating layers 530, a plurality of rewiring conductive patterns 510c located on at least one of top surfaces and bottom surfaces of the plurality of rewiring insulating layers 530, and a plurality of rewiring via patterns 520c passing through at least one of the plurality of rewiring insulating layers 530 and connected to the plurality of rewiring conductive patterns 510c.

The rewiring conductive patterns 510c and the rewiring via patterns 520c may be electrically connected to the through-electrodes 150 and the additional through-electrodes 152 of the first device layer DL1c. The external connection terminals 550 contacting the rewiring conductive patterns 510c and electrically connected to the plurality of through-electrodes 150 of the first device layer DL1c and additional external connection terminals 552 electrically or thermally connected to the plurality of additional through-electrodes 152 may be attached to the rewiring structure RDSc.

In the semiconductor package 1c according to the example embodiment of the inventive concepts, when the number of electrical paths desired by the upper semiconductor chips UCc is relatively great, the interposer region IR including the plurality of additional through-electrodes 152 may be located in each of the first device layer DL1c and the second device layer DL2c and the plurality of additional through-electrodes 152 may be used as additional electrical paths.

Alternatively, in the semiconductor package 1c according to the example embodiment of the inventive concepts, when heat generated in the upper semiconductor chip UCc is relatively large, the plurality of additional chip connection pads 262, the plurality of additional through-electrodes 152, and the plurality of additional external connection terminals 552 may be used as heat transfer paths and heat generated in the upper semiconductor chip UCc may be discharged outward.

Figure 9A:
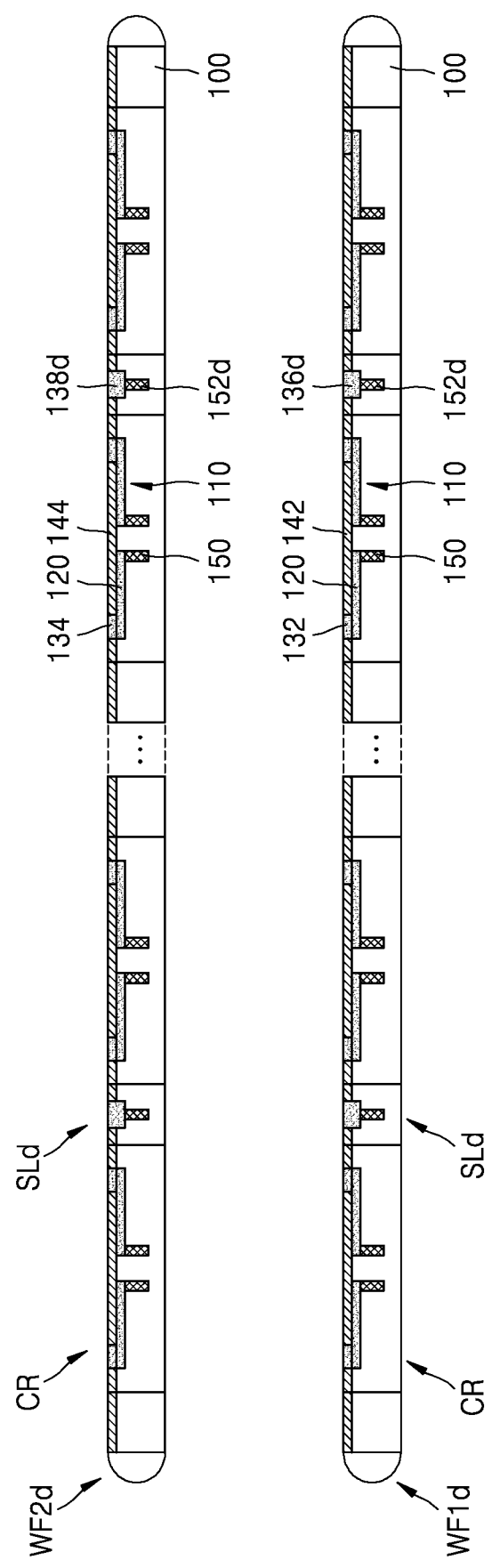
Figure 10:
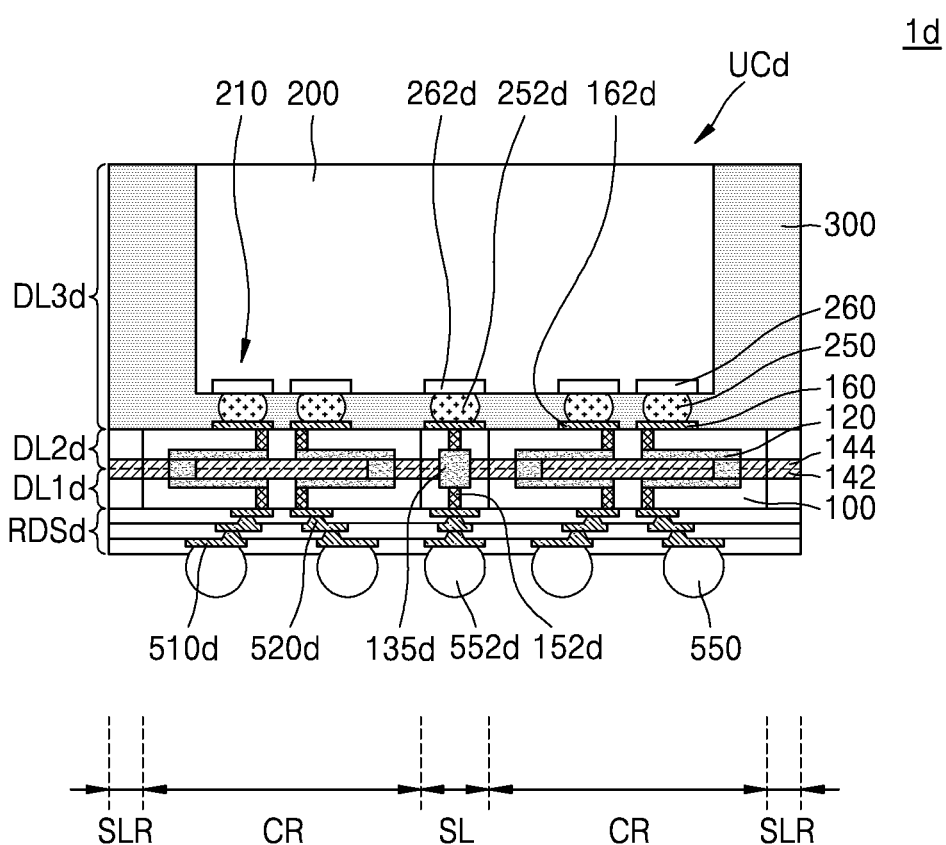
FIG. 10 is a cross-sectional view of the semiconductor package formed by the method illustrated in FIGS. 9A through 9C according to an example embodiment.

FIGS. 9A through 9C are cross-sectional views sequentially illustrating a method of manufacturing a semiconductor package according to an embodiment. FIG. 10 is a cross-sectional view of the semiconductor package according to an example embodiment, and the same description as that made with reference to FIGS. 1A through 2 and FIGS. 7A through 8 will not be given in FIGS. 9A through 10.

Referring to FIG. 9A, a first wafer WF1d and a second wafer WF2d are prepared. Each of the first wafer WF1d and the second wafer WF2d may include the plurality of semiconductor chip regions CR divided by scribe lane regions SLd. The scribe lane regions SL of each of the first wafer WF1 and the second wafer WF2 of FIG. 1A are replaced with the scribe lane regions SLd of each of the first wafer WF1d and the second wafer WF2d, and thus the description will focus on the scribe lane regions SLd.

Each of the scribe lane regions SLd of the first wafer WF1d includes a plurality of first additional connection pads 136d and a plurality of additional through-electrodes 152d connected to the plurality of first additional connection pads 136d, and each of the scribe lane regions SLd of the second wafer WF2d includes a plurality of second additional connection pads 138d and the plurality of additional through-electrodes 152d connected to the plurality of second additional connection pads 138d. The first cover insulating layer 142 and the second cover insulating layer 144 may cover side surfaces of the plurality of first additional connection pads 136d and the plurality of second additional connection pads 138d and may not cover and may expose top surfaces of the plurality of first additional connection pads 136d and the plurality of second additional connection pads 138d in the scribe lane regions SLd of the first wafer WF1 and the second wafer WF2.

Although the first additional connection pads 136d and the second additional connection pads 138d are thicker than the first internal connection pads 132 and the second internal connection pads 134 in FIG. 9A for convenience of explanation, example embodiments are not limited thereto.

Referring to FIG. 9B, the second wafer WF2d is attached to the first wafer WF1d so that the first cover insulating layer 142 and the second cover insulating layer 144 contact each other, the plurality of first internal connection pads 132 and the plurality of second internal connection pads 134 correspond to each other, and the plurality of first additional connection pads 136d and the plurality of second additional connection pads 138d correspond to each other.

Referring to FIGS. 9B and 9C, the plurality of device bonded pads 130 obtained by bonding the plurality of first internal connection pads 132 to corresponding ones of the plurality of second internal connection pads 134 and a plurality of additional bonded pads 135d obtained by bonding the plurality of first additional connection pads 136d and the plurality of second additional connection pads 138d are formed.

Referring to FIG. 10, a semiconductor package 1d is formed by performing a process the same or substantially similar to the above process of FIGS. 1D through 1I on a resultant structure of FIG. 9C. In the semiconductor package 1d, a rewiring structure RDSd, a first device layer DL1d including at least two semiconductor chip regions CR divided by the scribe lane region SLd, a second device layer DL2d including at least two semiconductor chip regions CR divided by the scribe lane region SLd, and a third device layer DLdc including an upper semiconductor chip UCd may be sequentially stacked.

The first device layer DL1d may include the first semiconductor substrate 100 including at least two semiconductor chip regions CR divided by the scribe lane region SLd, the wiring structure 120, the first cover insulating layer 142, the first semiconductor device 110 and the plurality of through-electrodes 150 of the semiconductor chip region CR, and the plurality of additional through-electrodes 152d of the scribe lane region SLd, the second device DL2d may include the first semiconductor substrate 100 including at least two semiconductor chip regions CR divided by the scribe lane region SLd, the wiring structure 120, the second cover insulating layer 144, the first semiconductor device 110 and the plurality of through-electrodes 150 of the semiconductor chip region CR, and the plurality of additional through-electrodes 152d of the scribe lane region SLd, and the second device layer DL2d may be located on the first device layer DL1d so that the first cover insulating layer 142 and the second cover insulating layer 144 contact each other. The device bonded pads 130 may pass through the first cover insulating layer 142 and the second cover insulating layer 144 in the semiconductor chip region CR, and may electrically connect the through-electrodes 150 of the first device layer DL1d to the through-electrodes 150 of the second device layer DL2d. The additional bonded pads 135d may pass through the first cover insulating layer 142 and the second cover insulating layer 144 in the scribe lane region SLd and may electrically connect the additional through-electrodes 152d of the first device layer DL1d to the additional through-electrodes 152d of the second device layer DL2d.

The plurality of upper connection pads 160 electrically connected to the plurality of through-electrodes 150 and a plurality of additional upper connection pads 162*d* electrically connected to the plurality of additional through-electrodes 152*d* may be located on the second device layer DL2*d*.

The upper semiconductor chip UCd may include the second semiconductor substrate 200, the second semiconductor device 210, the plurality of chip connection pads 260, and a plurality of additional chip connection pads 262*d*. The plurality of chip connection terminals 250 may be located between the plurality of upper connection pads 160 and the plurality of chip connection pads 260 corresponding to each other, and a plurality of additional chip connection terminals 252*d* may be located between the plurality of additional upper connection pads 162*d* and the plurality of additional chip connection pads 262*d* corresponding to each other.

The rewiring structure RDSd may include the plurality of rewiring insulating layers 530, a plurality of rewiring conductive patterns 510*d* located on at least one of top surfaces and bottom surfaces of the plurality of rewiring insulating layers 530, and a plurality of rewiring via patterns 520*d* passing through at least one of the plurality of rewiring insulating layers 530 and connected to the plurality of rewiring conductive patterns 510*d*. The rewiring conductive patterns 510*d* and the rewiring via patterns 520*d* may be electrically connected to the through-electrodes 150 and the additional through-electrodes 152 of the first device layer DL1*d*. The external connection terminals 550 contacting the rewiring conductive patterns 510*d* and electrically connected to the plurality of through-electrodes 150 of the first device layer DL1*d* and additional external connection terminal 552*d* electrically or thermally connected to the plurality of additional through-electrodes 152*d* may be attached to the rewiring structure RDSd.

Although only one additional bonded pad 135*d*, one additional through-electrode 152*d* of each of the first device layer DL1*d* and the second device layer DL2*d*, one additional upper connection pad 162*d*, one additional chip connection terminal 252*d*, one additional chip connection pad 262*d*, and one additional external connection terminal 552*d* are illustrated in FIG. 10, example embodiments are not limited thereto and a plurality of elements may be located between two semiconductor chip regions CR in a direction in which the scribe lane region SLd extends, or in a direction between the two semiconductor chip regions CR.

FIGS. 11A through 11E are cross-sectional views sequentially illustrating a method of manufacturing a semiconductor package according to an example embodiment. FIG. 12 is a cross-sectional view of the semiconductor package formed by the method illustrated in FIGS. 11A through 11E, according to an example embodiment, and the same description as that made with reference to FIGS. 5A through 6 and FIGS. 7A through 8 will not be given.

Referring to FIG. 11A, the plurality of lower semiconductor chips DC are attached to the first wafer WF1*c* to correspond to the plurality of semiconductor chip regions CR of the first wafer WF1*c*. The first wafer WF1*c* and the lower semiconductor chips DC are substantially the same as the first wafer WF1*c* of FIG. 7A and the lower semiconductor chips DC of FIG. 5A, and thus a detailed explanation thereof will not be given.

Referring to FIGS. 11A and 11B, the plurality of device bonded pads 130 obtained by bonding the plurality of first internal connection pads 132 and the plurality of second internal connection pads 134 corresponding to each other are formed.

Figure 11C:
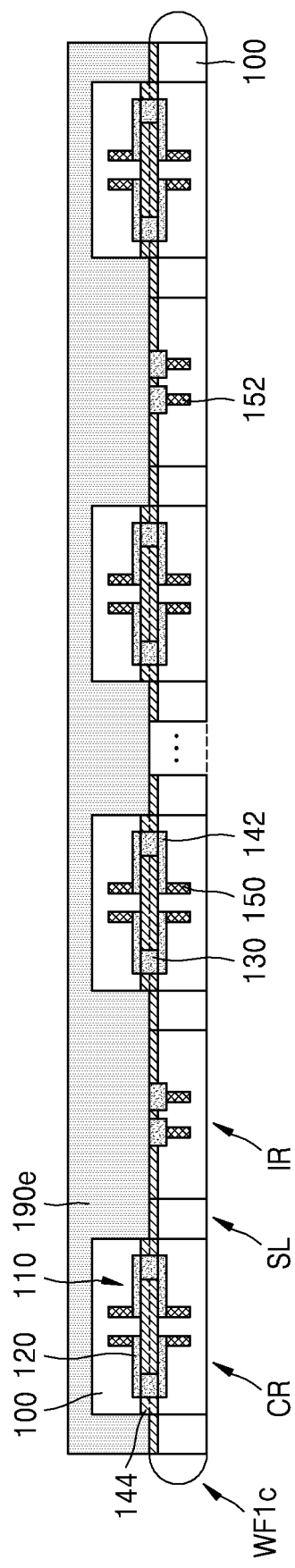
Figure 12:
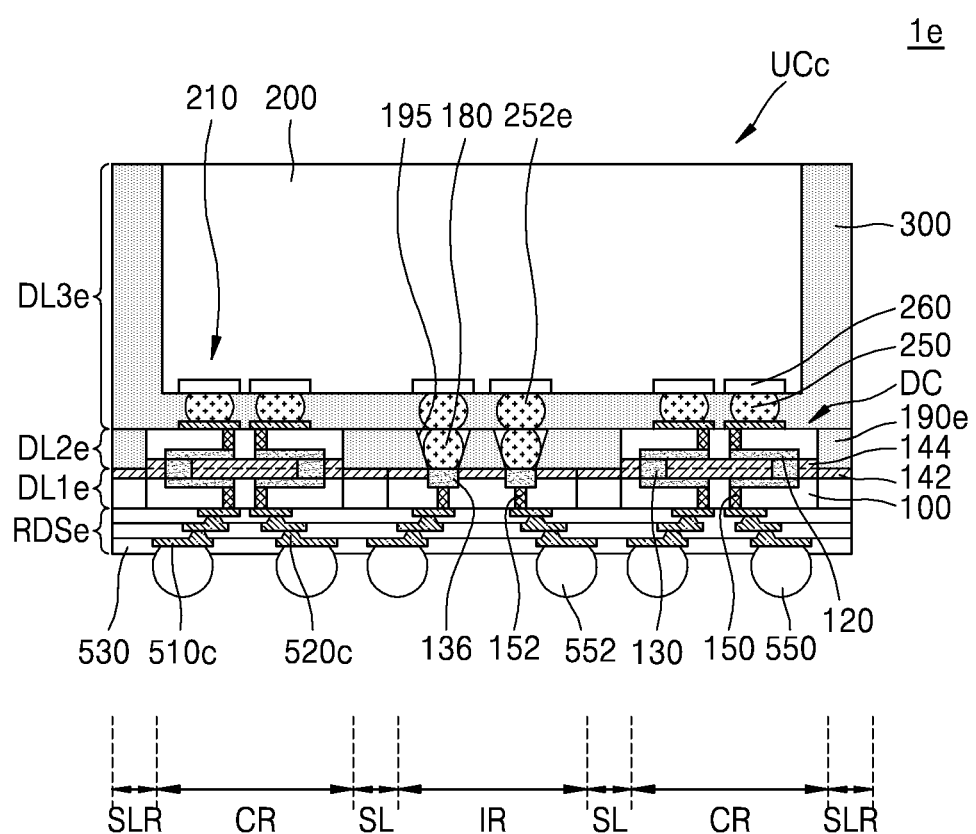
FIG. 12 is a cross-sectional view of the semiconductor package formed by the method illustrated in FIGS. 11A through 11E, according to an example embodiment.

Referring to FIG. 11C, a filling molding member 190*e* filling spaces between the plurality of lower semiconductor chips DC and covering the plurality of lower semiconductor chips DC is formed on the first wafer WF1*c*. The filling molding member 190*e* may be formed of, for example, an EMC.

Figure 11D:
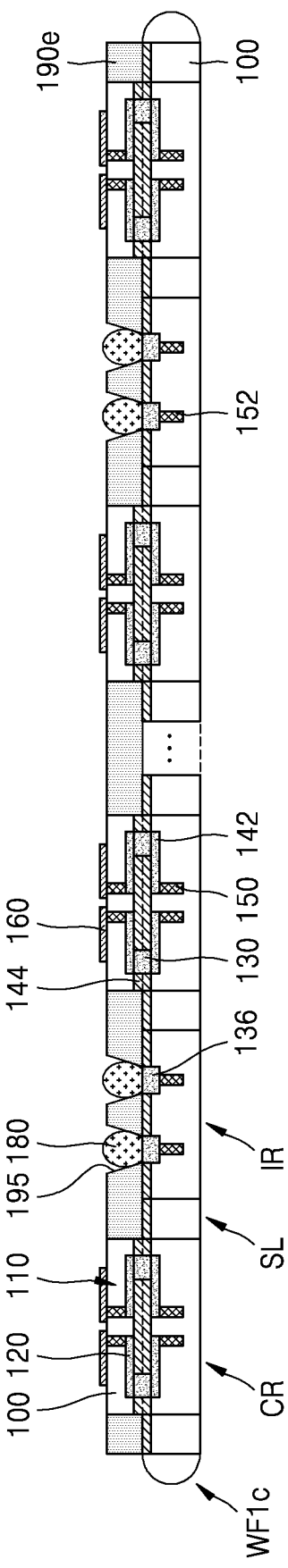

Referring to FIG. 11D, a portion of the first semiconductor substrate 100 and a portion of the filling molding member 190*e* are removed in the plurality of lower semiconductor chips DC to expose the through-electrodes 150 of the plurality of lower semiconductor chips DC.

Next, the plurality of upper connection pads 160 respectively electrically connected to the plurality of through-electrodes 150 are formed on the first semiconductor substrate 100 of the plurality of lower semiconductor chips DC. After a plurality of through-holes 195 through which the plurality of first additional connection pads 136 are exposed are formed in the interposer region IR of the first wafer WF1*c* by further removing a portion of the filling molding member 190*e*, a plurality of through-mold vias 180 filling at least parts of the plurality of through-holes 195 and connected to the plurality of first additional connection pads 136 are formed.

Figure 11E:
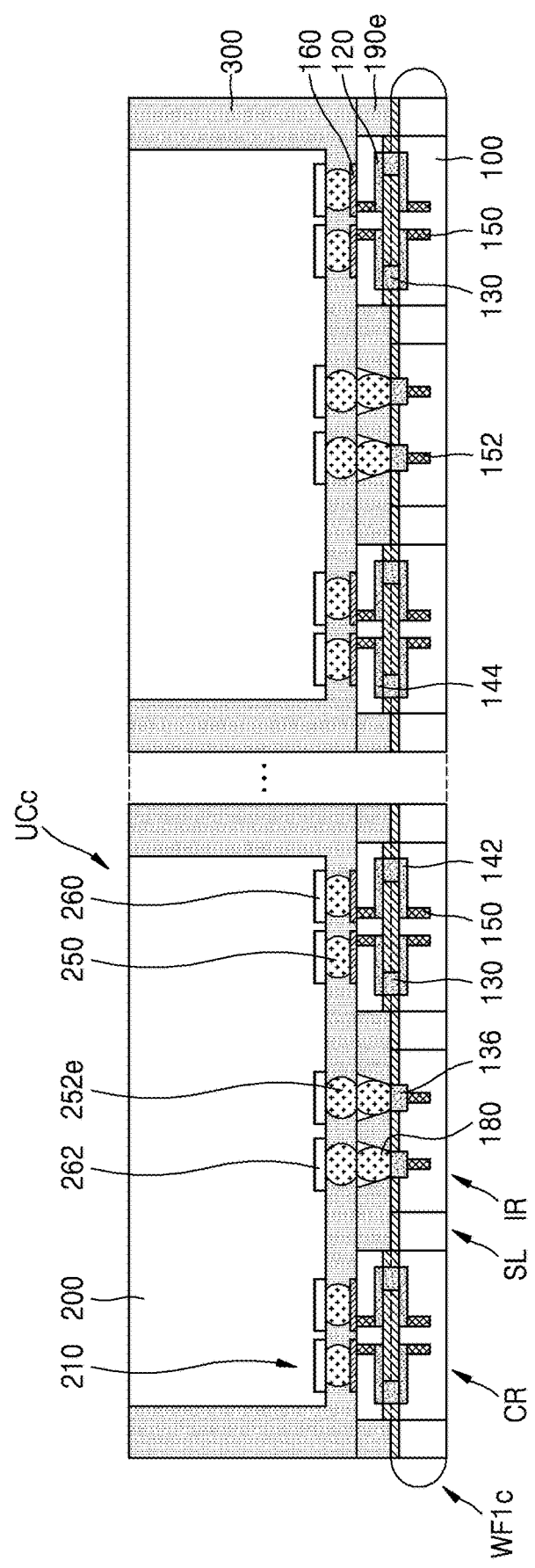

Referring to FIG. 11E, the upper semiconductor chip UCc is attached to the plurality of lower semiconductor chips DC and the filling molding member 190*e*. The upper semiconductor chip UCc may include the second semiconductor substrate 200, the second semiconductor device 210, the plurality of chip connection pads 260, and the plurality of additional chip connection pads 262. The plurality of chip connection terminals 250 may be located between the plurality of upper connection pads 160 and the plurality of chip connection pads 260 corresponding to each other, and a plurality of additional chip connection terminals 252*e* may be located between the plurality of through-mold vias 180 and the plurality of additional chip connection pads 262 corresponding to each other. The molding member 300 surrounding the upper semiconductor chip UCc is formed on the plurality of lower semiconductor chips DC and the filling molding member 190*e*.

Referring to FIG. 12, a semiconductor package 1*e* is formed by performing the above process of FIGS. 1G through 1I on a resultant structure of FIG. 11E. The second device layer DL2*c* of the semiconductor package 1*c* of FIG. 8 is replaced with a second device layer DL2*e* of the semiconductor package 1*e*, and the additional chip connection terminals 252 of the third device layer DL3*c* of FIG. 8 are replaced with the additional chip connection terminals 252*e* of a third device layer DL3*e* of the semiconductor package 1*e*, and thus the description will focus on the difference.

In the semiconductor package 1*e*, the rewiring structure RDSc, the first device layer DL1*c* including at least two semiconductor chip regions CR and at least one interposer region IR, the second device layer DL2*e* including at least two lower semiconductor chips DC, and the third device layer DL3*e* including the upper semiconductor chip UCc may be sequentially stacked. The second device layer DL2*e* of the semiconductor package 1*e* includes at least two lower semiconductor chips DC, instead of at least two semiconductor chip regions CR of the second device layer DL2*c* of FIG. 8, and includes the filling molding member 190*e* having the plurality of through-holes 195, instead of the interposer region IR, and the plurality of through-mold vias 180 formed in the plurality of through-holes 195. The plurality of additional chip connection terminals 252*e* may be located between the plurality of through-mold vias 180 and the plurality of additional chip connection pads 262, and the plurality of through-mold vias 180 and the plurality of additional chip connection terminals 252e corresponding to each other may be directly connected to each other. Accordingly, the semiconductor package 1e may not include the additional upper connection pads 162 of the semiconductor package 1c of FIG. 8.

Figure 13A:
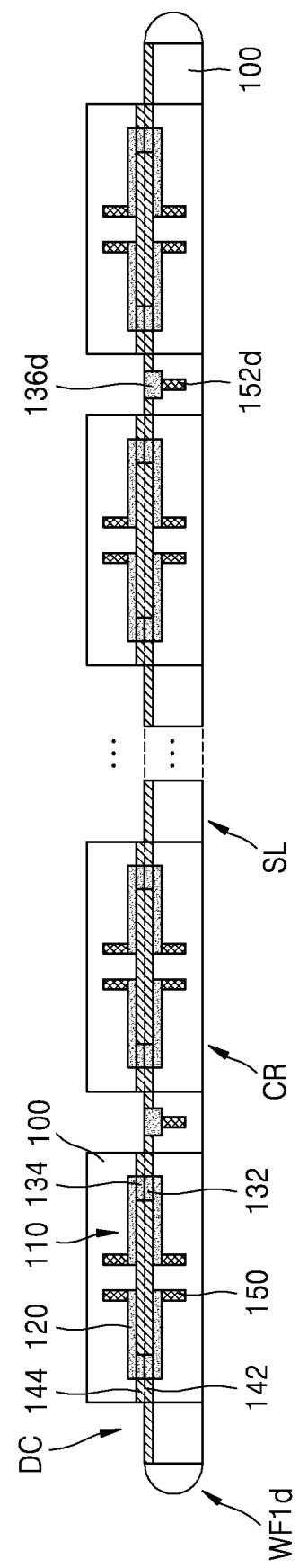
FIGS. 13A and 13B are cross-sectional views sequentially illustrating a method of manufacturing a semiconductor package according to an example embodiment.
Figure 13B:
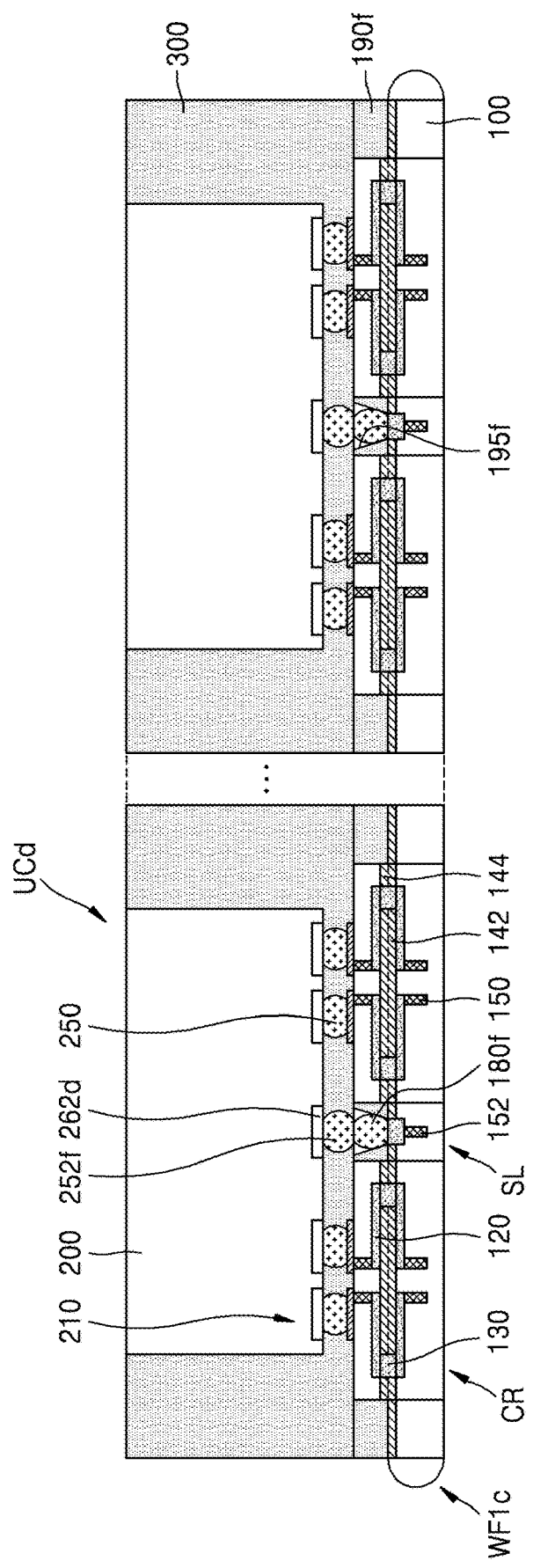
Figure 14:
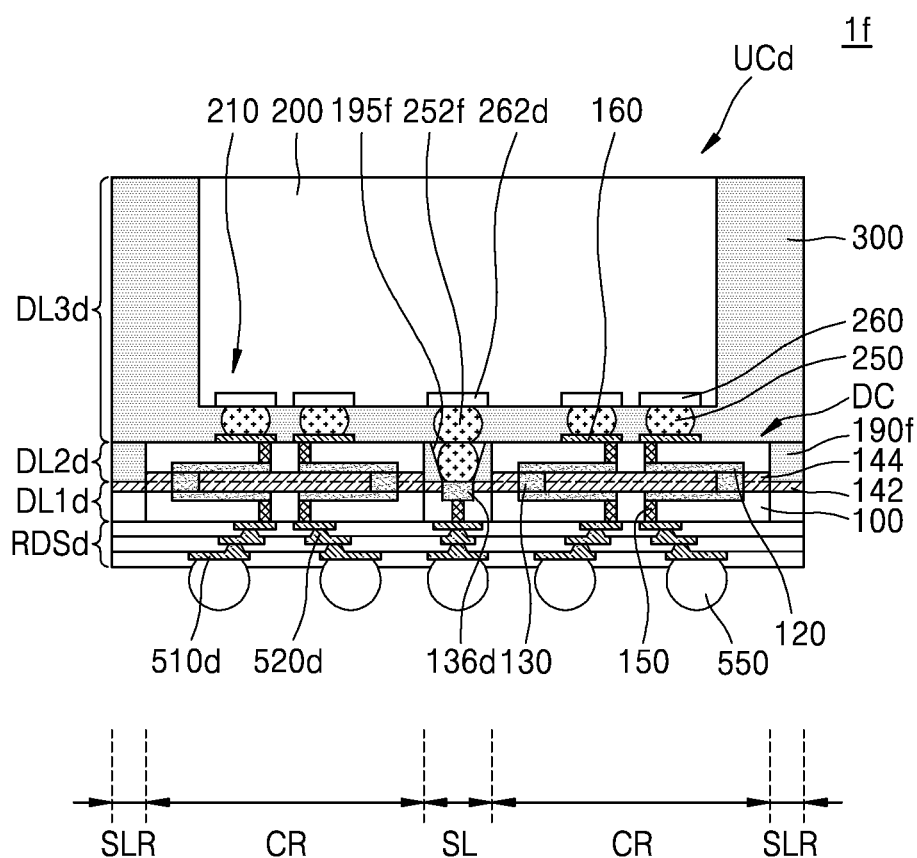
FIG. 14 is a cross-sectional view of the semiconductor package formed by the method illustrated in FIGS. 13A through 13B, according to an example embodiment.

FIGS. 13A and 13B are cross-sectional views sequentially illustrating a method of manufacturing a semiconductor package according to an example embodiment and FIG. 14 is a cross-sectional view of the semiconductor package formed by the method illustrated in FIGS. 13A through 13B, according to an example embodiment, and the same description as that made with reference to FIGS. 1A through 2, FIGS. 5A through 6, and FIGS. 9A through 10 will not be given.

Referring to FIG. 13A, the plurality of lower semiconductor chips DC are attached to the first wafer WF1d to correspond to the plurality of semiconductor chip regions CR of the first wafer WF1d. the first wafer WF1d and the lower semiconductor chips DC are the same as or substantially similar to the first wafer WF1d of FIG. 9A and the lower semiconductor chips DC of FIG. 5A, and thus a detailed explanation thereof will not be given.

Referring to FIG. 13B, the plurality of device bonded pads 130 are formed by performing the above process of FIG. 11B, and the plurality of upper connection pads 160 respectively electrically connected to the plurality of through-electrodes 150 are formed on the first semiconductor substrate 100 of the plurality of lower semiconductor chips DC to expose the through-electrodes 150 of the plurality of lower semiconductor chips DC by performing a process similar to that of FIGS. 11C and 11D. Also, a filling molding member 190f filling spaces between the plurality of lower semiconductor chips DC and having a plurality of through-holes 195f is formed on a first wafer WF1f, and a plurality of through-mold vias 180f filling at least parts of the plurality of through-holes 195f and connected to the plurality of first additional connection pads 136d are formed.

Next, the upper semiconductor chip UCd is attached to the plurality of lower semiconductor chips DC and the filling molding member 190f. The upper semiconductor chip UCd may include the second semiconductor substrate 200, the second semiconductor device 210, the plurality of chip connection pads 260, and the plurality of additional chip connection pads 262d. The plurality of chip connection terminals 250 may be located between the plurality of upper connection pads 160 and the plurality of chip connection pads 260 corresponding to each other, and a plurality of additional chip connection terminals 252f may be located between the plurality of through-mold vias 180f and the plurality of additional chip connection pads 262d corresponding to each other. The molding member 300 surrounding the upper semiconductor chip UCf is formed on the plurality of lower semiconductor chips DC and the filling molding member 190f.

Referring to FIG. 14, a semiconductor package 1f is formed by performing the above process of FIG. 11E and FIGS. 1G through 1I on a resultant structure of FIG. 12B. The second device layer DL2d of the semiconductor package 1d of FIG. 10 is replaced with a second device layer DL2f of the semiconductor package 1f and the additional chip connection terminals 252d of the third device layer DL3d of FIG. 10 are replaced with the additional chip connection terminals 252f of a third device layer DL3f, and thus the description will focus on the difference.

In the semiconductor package 1f, the rewiring structure RDSd, the first device layer DL1d including at least two semiconductor chip regions CR divided by the scribe lane region SLd, the second device layer DL2f including at least two lower semiconductor chips DC, and the third device layer DL3f including the upper semiconductor chip UCd may be sequentially stacked. The second device layer DL2f of the semiconductor package 1f includes at least two lower semiconductor chips DC, instead of at least two semiconductor chip regions CR of the second device layer DL2d of FIG. 10, and includes the filling molding member 190 having the plurality of through-holes 195f, instead of the scribe lane region SLd, and the plurality of through-mold vias 180f formed in the plurality of through-holes 195f. The plurality of additional chip connection terminals 252f may be located between the plurality of through-mold vias 180f and the plurality of additional chip connection pads 262d, and the plurality of through-mold vias 180f and the plurality of additional chip connection terminals 252f corresponding to each other may be directly connected to each other. Accordingly, the semiconductor package 1f may not include the additional upper connection pads 162d of the semiconductor package 1d of FIG. 10.

Figure 15A:
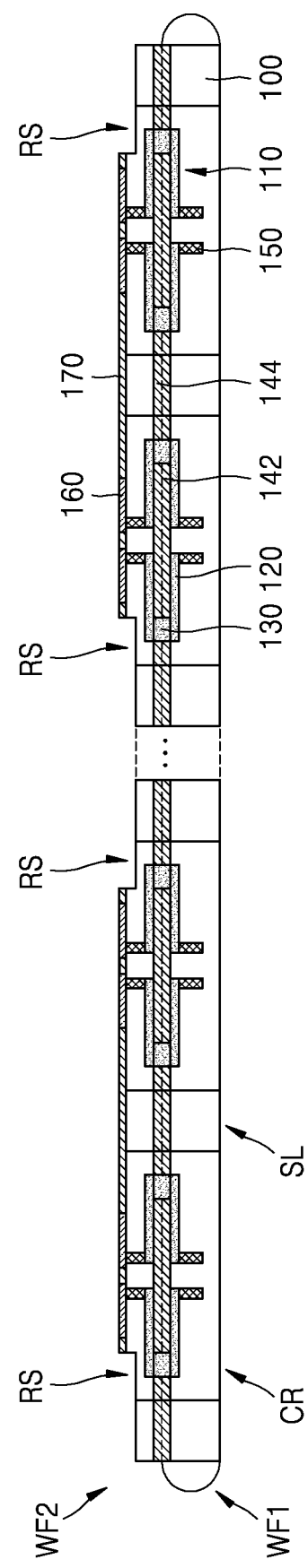
FIGS. 15A and 15B are cross-sectional views sequentially illustrating a method of manufacturing a semiconductor package according to an example embodiment.
Figure 15B:
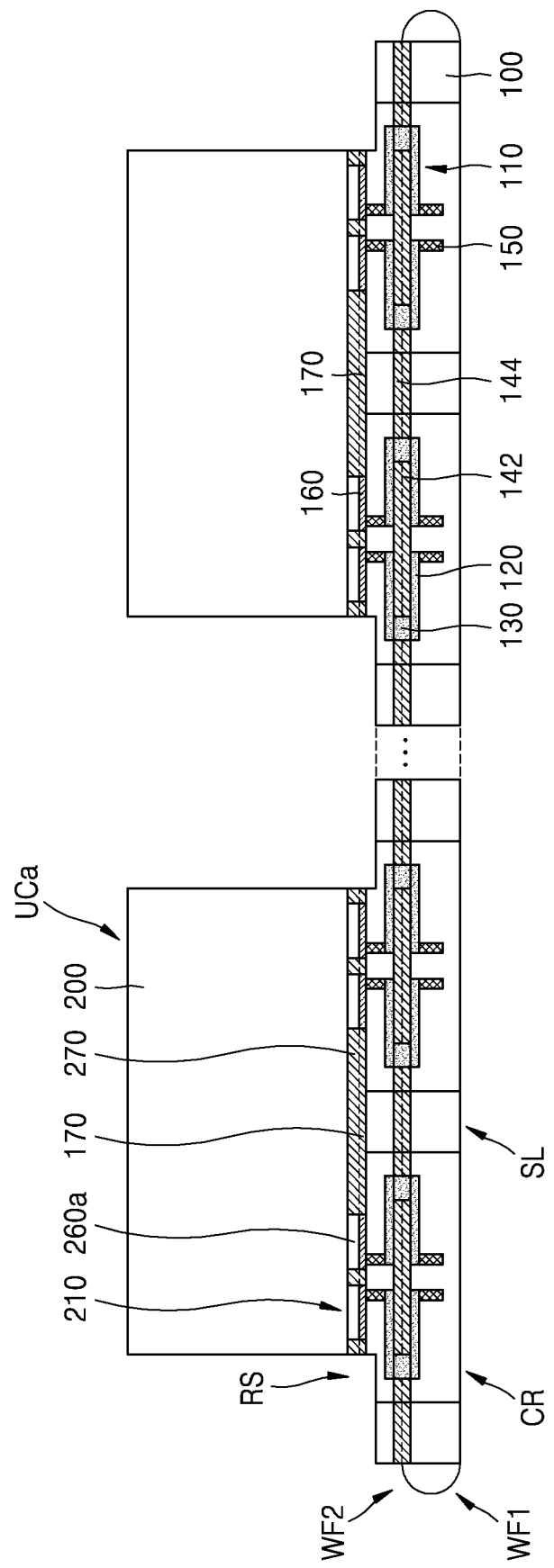
Figure 16:
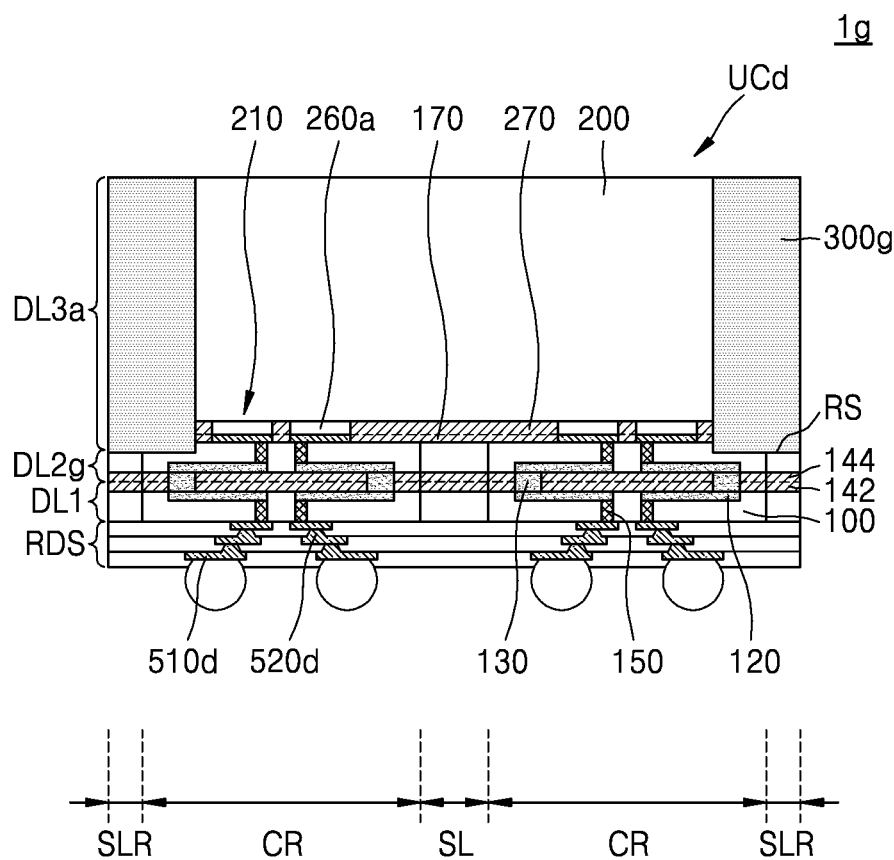
FIG. 16 is a cross-sectional view of the semiconductor package formed by the method illustrated in FIGS. 15A and 15B, according to an example embodiment.

FIGS. 15A and 15B are cross-sectional views sequentially illustrating a method of manufacturing a semiconductor package according to an example embodiment and FIG. 16 is a cross-sectional view of the semiconductor package according to an example embodiment, and the same description as that made with reference to FIGS. 3A through 4 will not be given. In detail, FIG. 15A illustrates a step after FIG. 3A.

Referring to FIG. 15A, a recess space RS is formed by removing a portion of the third cover insulating layer 170 and an upper portion of the first semiconductor substrate 100 of the second wafer WF2. The recess space RS may be formed by forming a mask pattern covering a remaining portion of the third cover insulating layer 170 and the plurality of upper connection pads 160 on the second wafer WF2 and then removing a portion of the third cover insulating layer 170 and an upper portion of the first semiconductor substrate 100 of the second wafer WF2 by using the mask pattern as an etch mask. A width of the mask pattern may be equal to or greater than a width of the upper semiconductor chip UCa of FIG. 15B.

Referring to FIG. 15B, the upper semiconductor chip UCa including the plurality of chip connection pads 260a is attached to the second wafer WF2 including the recess space RS. The upper semiconductor chip UCa may be attached to the second wafer WF2 so that the plurality of chip connection pads 260a correspond to the plurality of upper connection pads 160. The upper semiconductor chip UCa may be attached to the second wafer WF2 to be aligned with respect to the recess space RS, and the third cover insulating layer 170 and the chip cover insulating layer 270 may be adhered to each other.

Referring to FIG. 16, the plurality of chip bonded pads 265 obtained by bonding the plurality of upper connection pads 160 and the plurality of chip connection pads 260a corresponding to each other and a molding member 300g filling the recess RS in the second wafer WF2 and surrounding the upper semiconductor chip UCa are formed by performing the above process of FIG. 3C on a resultant structure of FIG. 15B. Next, a semiconductor package 1g is formed by performing the above process of FIGS. 1G through 1I. The second device layer DL2 and the molding member 300 of the semiconductor package 1a of FIG. 4 are replaced with a second device layer DL2g and the molding member 300g of the semiconductor package 1g, and thus the description will focus on the difference.

In the semiconductor package 1g, the rewiring structure RDS, the first device layer DL1 including at least two semiconductor chip regions CR divided by the scribe lane region SL, the second device layer DL2g including at least two lower semiconductor chips DC, and the third device layer DL3a including the upper semiconductor chip UCa may be sequentially stacked. The first semiconductor substrate 100 of the second device layer DL2g of the semiconductor package 1g may include the recess space RS, and the recess space RS may fill the molding member 300g. The upper semiconductor chip UCa may be attached to a protrusion defined by the recess space RS of the first semiconductor substrate 100 of the second device layer DL2g.

Figure 18:
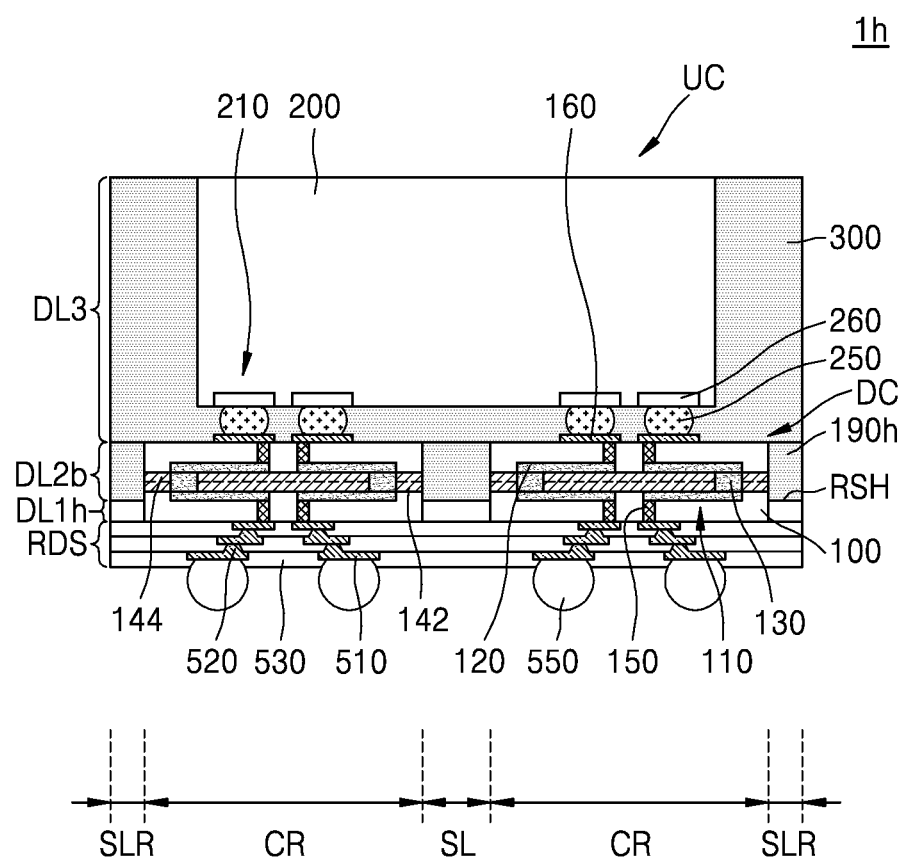
FIG. 18 are a cross-sectional view of the semiconductor package formed by the method illustrated in FIGS. 17A and 17B, according to an example embodiment.

FIGS. 17A and 17B are cross-sectional views sequentially illustrating a method of manufacturing a semiconductor package according to an example embodiment. FIG. 18 is a cross-sectional view of the semiconductor package formed by the method illustrated in FIGS. 17A and 17B, according to an example embodiment, and the same description as that made with reference to FIGS. 5A through 6 will not be given. In detail, FIG. 17A illustrates a step before the plurality of lower semiconductor chips DC are attached to the first wafer WF1 in FIG. 5A.

Referring to FIG. 17A, a recess space RSh is formed in the first wafer WF1 by removing a portion of the first cover insulating layer 142 and an upper portion of the first semiconductor substrate 100. The recess space RSh may be formed by forming a mask pattern covering a remaining portion of the first cover insulating layer 142 and the plurality of first internal connection pads 132 on the first wafer WF1 and then removing a portion of the first cover insulating layer 142 and an upper portion of the first semiconductor substrate 100 by using the mask pattern as an etch mask. A width of the mask pattern may be equal to or greater than a width of each of the lower semiconductor chips DC.

Referring to FIG. 17B, the plurality of lower semiconductor chips DC are attached to the first wafer WF1 including the recess space RSh to correspond to the plurality of semiconductor chip regions CR of the first wafer WF1. The plurality of lower semiconductor chips DC may be attached to the first wafer WF1 so that the first cover insulating layer 142 and the second cover insulating layer 144 contact each other and the plurality of first internal connection pads 132 and the plurality of second internal connection pads 134 correspond to each other.

The lower semiconductor chips DC may be attached to the first wafer WF1 to be aligned with respect to the recess space RSh, and the first cover insulating layer 142 and the second cover insulating layer 144 may be adhered to each other.

Referring to FIG. 18, a semiconductor package 1h is formed by performing the above process of FIGS. 5C and 5D on a resultant structure of FIG. 17B. The first device layer DL1 and the filling molding member 190 of the semiconductor package 1b of FIG. 6 are replaced with a first device layer DL1h and a filling molding member 190h of the semiconductor package 1h, and thus the description will focus on a difference.

In the semiconductor package 1h, the rewiring structure RDS, the first device layer DL1h, the second device layer DL2b, and the third device layer DL3 may be sequentially stacked. The first semiconductor substrate 100 of the first device layer DL1h of the semiconductor package 1h may include the recess space RSh, and the recess space RSh may fill the filling molding member 190h. The lower semiconductor chips DC may be attached to a protrusion defined by the recess space RSh of the first semiconductor substrate 100 of the first device layer DL1h.

Figure 19A:
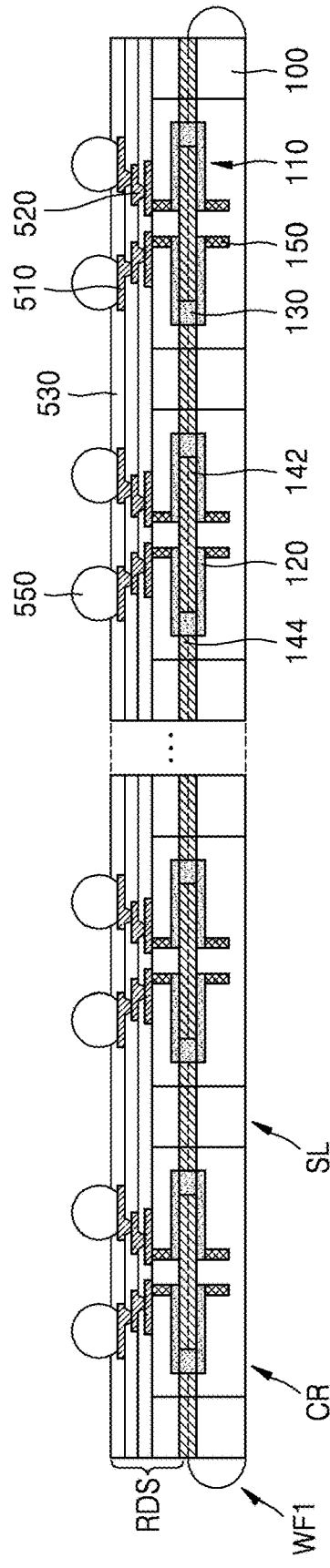
FIGS. 19A through 19C are cross-sectional views sequentially illustrating a method of manufacturing a semiconductor package according to an example embodiment.
Figure 19B:
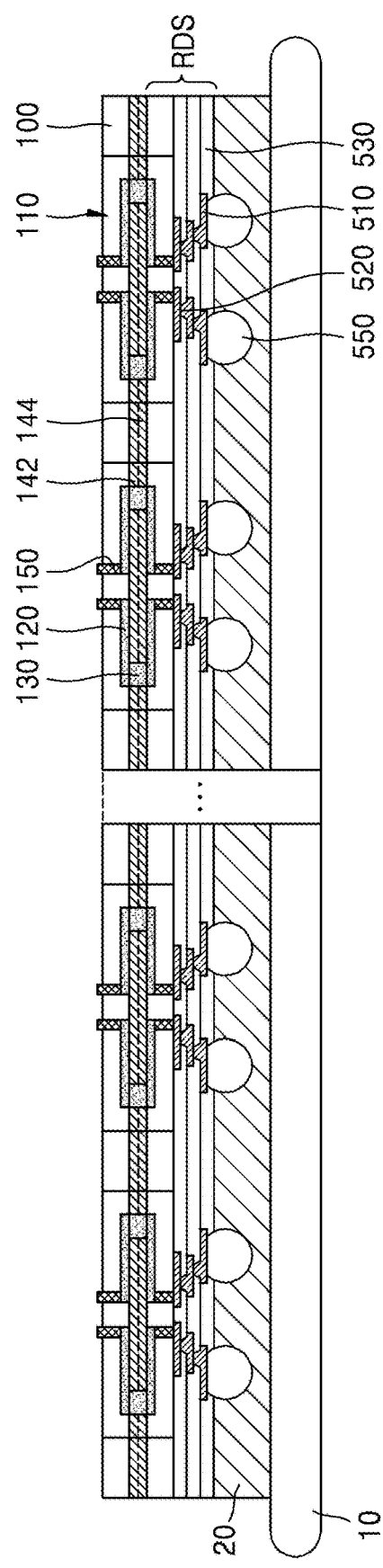
Figure 19C:
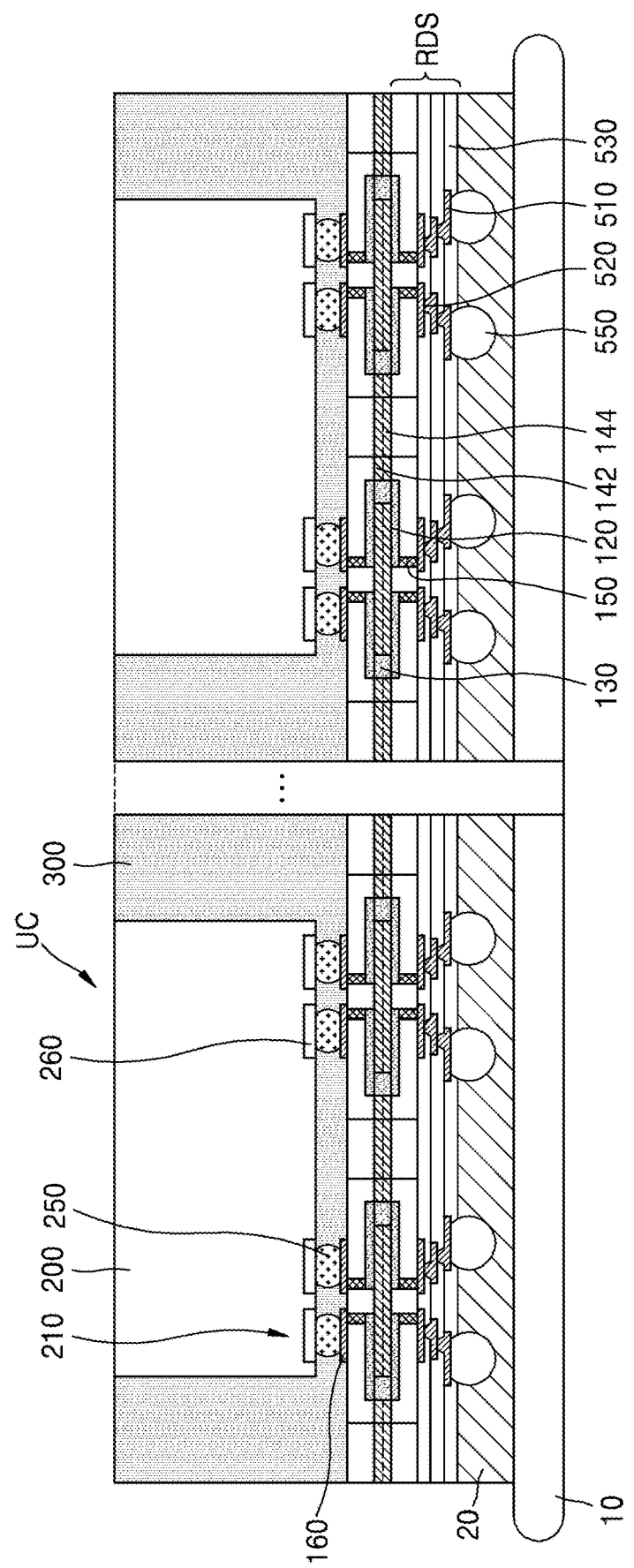

FIGS. 19A through 19C are cross-sectional views sequentially illustrating a method of manufacturing a semiconductor package according to an example embodiment, and the same description as that made with reference to FIGS. 1A through 2 will not be given. In detail, FIGS. 19A through 19C illustrate a step after FIG. 1D.

Referring to FIG. 19A, the rewiring structure RDs is formed on the first wafer WF1 by performing the above process of FIG. 1H on a resultant structure of FIG. 1D. The rewiring structure RDS may include the plurality of rewiring insulating layers 530, the plurality of rewiring conductive patterns 510 located on at least one of top surfaces and bottom surfaces of the plurality of rewiring insulating layers 530, and the plurality of rewiring via patterns 520 passing through at least one of the plurality of rewiring insulating layers 530 and connected to the plurality of rewiring conductive patterns 510. The plurality of external connection terminals 550 contacting the rewiring conductive patterns 510 and electrically connected to the plurality of through-electrodes 150 of the first wafer WF1 may be attached to the rewiring structure RDS.

Referring to FIG. 19B, after a resultant structure of FIG. 19B is turned upside down so that the rewiring structure RDs faces downward, the first wafer WF1 on which the rewiring structure RDS is formed is attached to a carrier substrate 10 with an adhesive film 20 therebetween. The adhesive film 20 may fill a space between the rewiring structure RDs and the carrier substrate 10 and may surround the external connection terminals 550.

Referring to FIG. 19C, the plurality of upper connection pads 160 are formed by performing the above process of FIG. 1E and FIG. 1F, and the upper semiconductor chip UC including the plurality of chip connection pads 260 electrically connected to the plurality of upper connection pads 160 is attached. The plurality of chip connection terminals 250 may be located between the plurality of upper connection pads 160 and the plurality of chip connection pads 260 corresponding to each other. The molding member 300 surrounding the upper semiconductor chip UC is formed on the second wafer WF2. Next, the semiconductor package 1 of FIG. 2 may be formed by performing the above process of FIG. 1I.

Also, it will be understood by one of ordinary skill in the art that any of the semiconductor packages 11a, 1b, 1c, 1d, 1e, 1f, 1g, and 1h of FIGS. 4, 6, 8, 10, 12, 14, 16, and 18 may be formed by using the above process of FIGS. 19A through 19C, and thus a detailed explanation will not be given.

Figure 20:
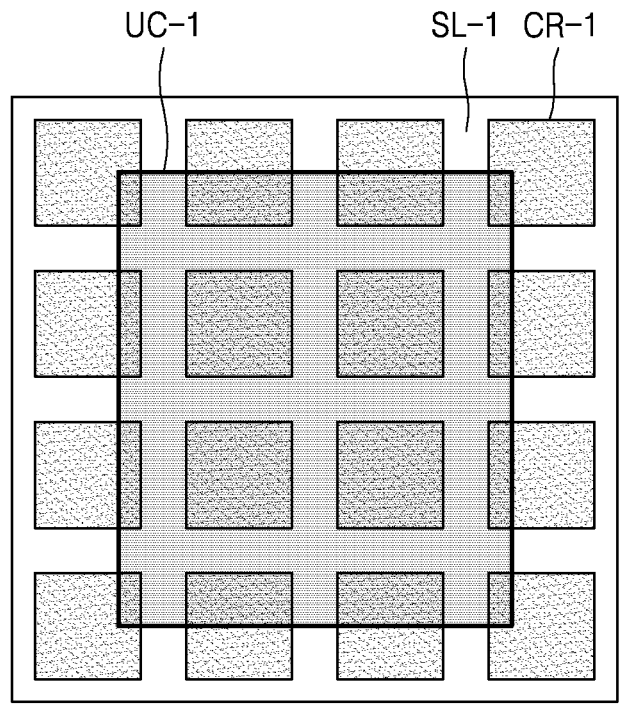
FIGS. 20 and 21 are plan views illustrating a layout of a plurality of semiconductor chips of a semiconductor package according to some example embodiments.
Figure 21:
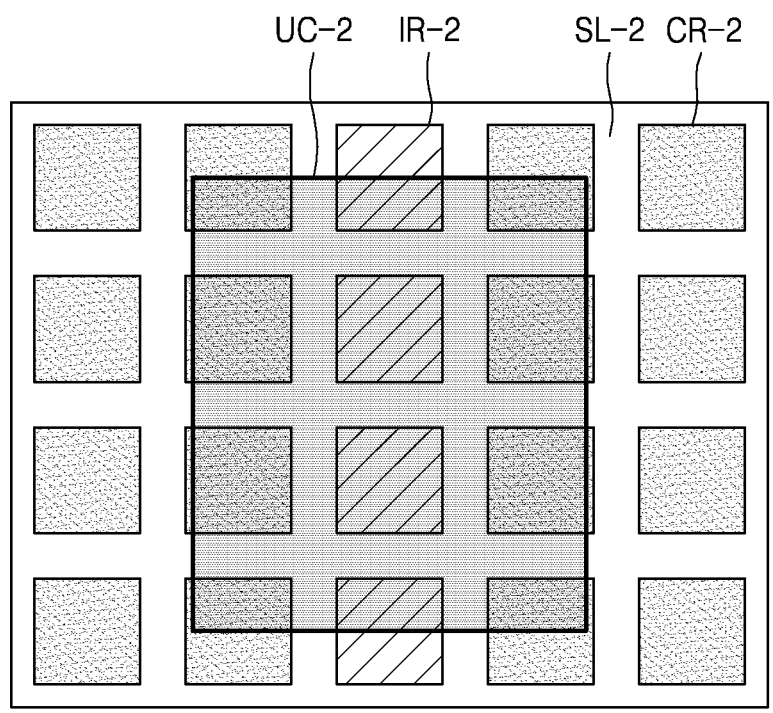

FIGS. 20 and 21 are plan views illustrating a layout of a plurality of semiconductor chips of a semiconductor package according to some example embodiments.

Referring to FIG. 20, a semiconductor package 2 may include an upper semiconductor chip UC-1 located over a plurality of semiconductor chip regions CR-1 divided by a scribe lane region SL-1. Each of the plurality of semiconductor chip regions CR-1 of FIG. 20 includes two stacked semiconductor chip regions or a lower semiconductor chip stacked on a semiconductor chip region. Although the semiconductor package 2 includes 16 semiconductor chip regions CR-1 in FIG. 20, example embodiments are not limited thereto and the semiconductor package 2 may include two or more semiconductor chip regions CR-1.

The semiconductor chip regions CR-1 may be the semiconductor chip regions CR of the first device layer DL1, DL1d, or DL1h, and the semiconductor chip regions CR of the second device layer DL2, DL2a, or DL2d or the lower semiconductor chips DC of the second device layer DL2b of FIG. 2, 4, 6, 10, 14, 16, or 18. The upper semiconductor chip UC-1 may be the upper semiconductor chip UC, UCa, or UCd of FIG. 2, 4, 6, 10, 14, 16, or 18. The scribe lane region SL-1 may be the scribe lane region SL or SLd of the first device layer DL1, DL1d, or DL1h of FIG. 2, 4, 6, 10, 14, 16, or 18 and the scribe lane region SL or SLd of the second device layer DL2, DL2a, or DL2d.

Referring to FIG. 21, a semiconductor package 2a may include a plurality of semiconductor chip regions CR-2 divided by a scribe lane region SL-2 and an upper semiconductor chip UC-2 located over a plurality of interposer regions IR-2. Each of the plurality of semiconductor chip regions CR-2 of FIG. 21 includes two stacked semiconductor chip regions, or a lower semiconductor chip stacked on a semiconductor chip region. Although the semiconductor package 2a of FIG. 21 includes 16 semiconductor chip regions CR-2 and 4 interposer regions IR-2, example embodiments are not limited thereto and the semiconductor package 2a may include two or more semiconductor chip regions CR-1 and one or more interposer regions IR-2.

The semiconductor chip regions CR-2 may be the semiconductor chip regions CR of the first device layer DL1c and the semiconductor chip regions CR or the lower semiconductor chips DC of the second device layer DL2c or DL2e of FIG. 8 or 12. The interposer regions IR-2 may be the interposer regions IR of the first device layer DL1c and the interposer regions IR of the second device layer DL2c of FIG. 8 or 12. The scribe lane region SL-2 may be the scribe lane region SL of the first device layer DL1c and the scribe lane region SL of the second device layer DL2c of FIG. 8 or 12.

Figure 22:
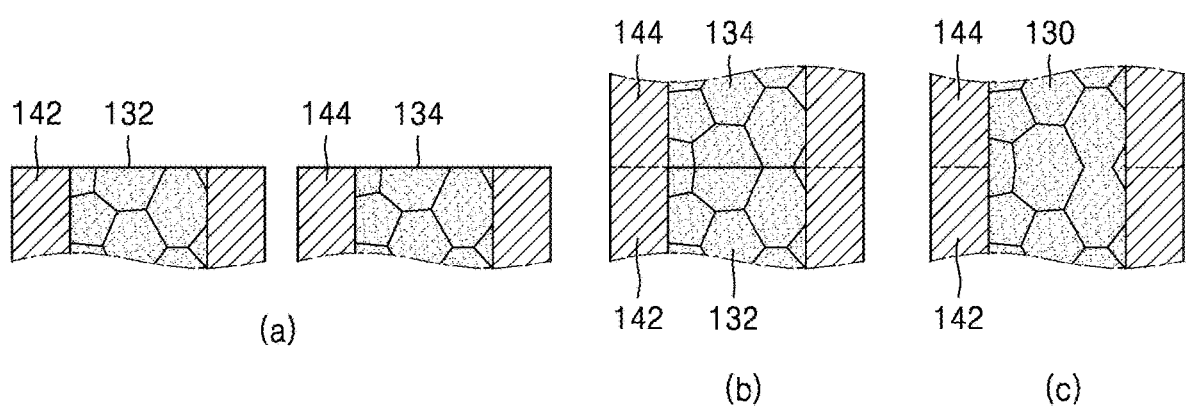
FIGS. 22 through 24 are cross-sectional views for conceptually describing a process of forming a device bonded pad, a chip bonded pad, and an additional bonded pad in a method of manufacturing a semiconductor package according to an embodiment.
Figure 23:
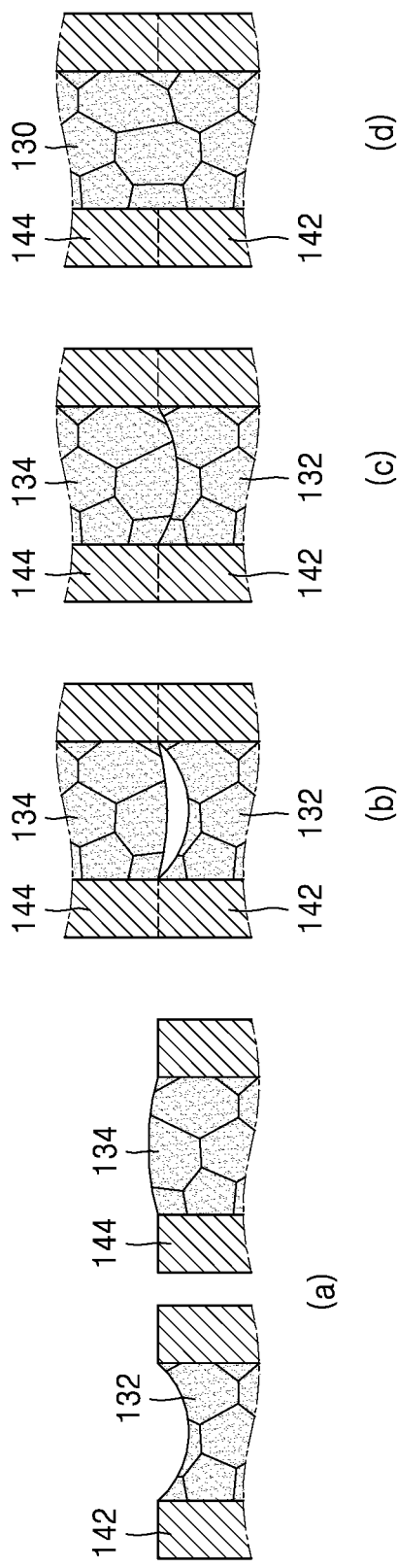
Figure 24:
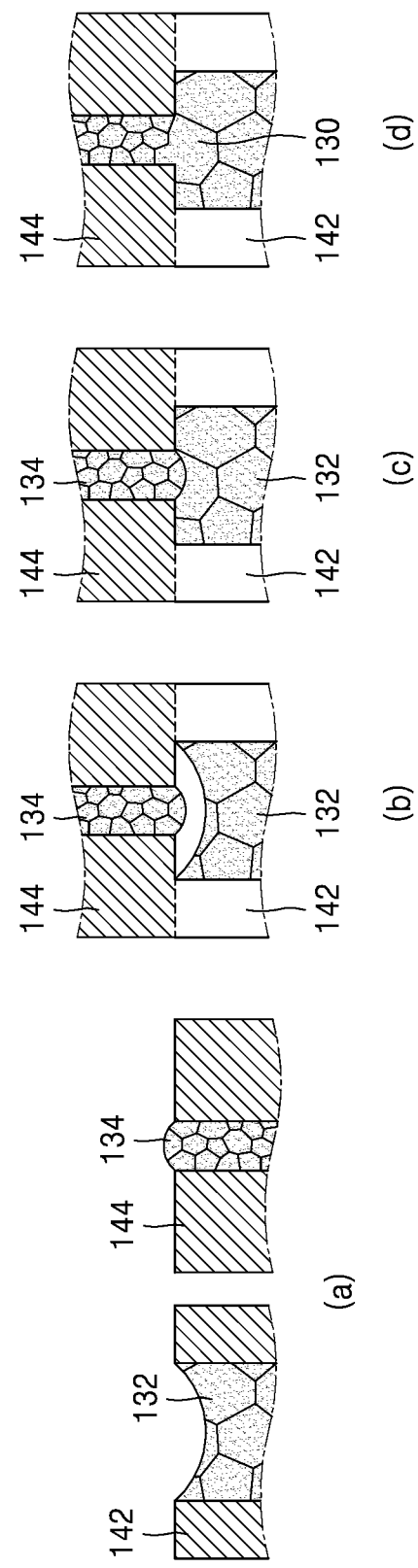

FIGS. 22 through 24 are cross-sectional views for conceptually describing a process of forming a device bonded pad, a chip bonded pad, and an additional bonded pad in a method of manufacturing a semiconductor package according to an example embodiment. A process of forming the device bonded pads 130 will be described with reference to FIGS. 22 through 24 and FIGS. 1A and 1C.

Referring to FIG. 22, as shown in (a), top surfaces of the first internal connection pad 132 and the second internal connection pad 134 and top surfaces of the first cover insulating layer 142 and the second cover insulating layer 144 may be on the same plane (e.g., may be coplanar). As shown in (b), the first cover insulating layer 142 and the second cover insulating layer 144 may contact each other by applying heat of a first temperature. As shown in (c), when heat of a second temperature is applied, metal atoms of the first internal connection pad 132 and the second internal connection pad 134 may be diffused to be integrated, thereby forming the plurality of device bonded pads 130.

Referring to FIG. 23, as shown in (a), a top surface of one of the first internal connection pad 132 and the second internal connection pad 134 may protrude and a top surface of the other may be recessed by adjusting a condition of a planarization process of forming the first internal connection pad 132 and the second internal connection pad 134. As shown in (b), when heat of a first temperature is applied, the first cover insulating layer 142 and the second cover insulating layer 144 may contact each other. As shown in (c), when heat of second temperature is applied, the first internal connection pad 132 and the second internal connection pad 134 may be expanded to contact each other. Next, as shown in (d), metal atoms of the first internal connection pad 132 and the second internal connection pad 134 may be diffused to be integrated, thereby forming the plurality of device bonded pads 130.

Referring to FIG. 24, as shown in (a), the first internal connection pad 132 and the second internal connection pad 134 may have different widths. As shown in (b), when heat of a first temperature is applied, the first cover insulating layer 142 and the second cover insulating layer 144 may contact each other. As shown in (c), when heat of a second temperature is applied, the first internal connection pad 132 and the second internal connection pad 134 may be expanded to contact each other. Next, as shown in (d), metal atoms of each of the first internal connection pad 132 and the second internal connection pad 134 may be diffused to be integrated, thereby forming the plurality of device bonded pads 130.

Because a semiconductor package according to some example embodiments of the inventive concepts may achieve a relatively fine patch without using an additional interposer, semiconductor package manufacturing costs may be reduced. Since the semiconductor package has a rewiring structure to which external connection terminals are connected, an additional printed circuit board may not be used, thereby making it possible to have a relatively smaller form factor.

What is claimed:
1. A semiconductor package comprising:
a first device layer including a first semiconductor substrate, a plurality of first semiconductor devices, a first cover insulating layer, and a plurality of first through-electrodes passing through at least a portion of the first device layer, the first semiconductor substrate including an active surface on which the plurality of first semiconductor devices is located, the first cover insulating layer covering the active surface of the first semiconductor substrate;
a second device layer including a second semiconductor substrate, a plurality of second semiconductor devices, a second cover insulating layer, a third cover insulating layer, and a plurality of second through-electrodes passing through at least a portion of the second device layer, the second semiconductor substrate including an active surface on which the plurality of second semiconductor devices is located, the second cover insulating layer covering the active surface of the second semiconductor substrate, the third cover insulating layer covering an inactive surface opposite to the active surface of the second semiconductor substrate, the plurality of second semiconductor devices vertically overlapping the plurality of first semiconductor devices, respectively, the second cover insulating layer in contact with the first cover insulating layer;
a third device layer including an upper semiconductor chip and a chip cover insulating layer facing the second device layer and contacting the third cover insulating layer, the upper semiconductor chip including a third semiconductor substrate having an active surface on which a third semiconductor device is located, vertically overlapping at least two of the plurality of first semiconductor devices, and vertically overlapping at least two of the plurality of second semiconductor devices, the chip cover insulating layer covering the active surface of the third semiconductor substrate;
a plurality of device bonded pads passing through the first cover insulating layer and the second cover insulating layer, the plurality of device bonded pads electrically connecting the plurality of first through-electrodes and the plurality of second through-electrodes to the upper semiconductor chip;

a plurality of chip bonded pads passing through the third cover insulating layer and the chip cover insulating layer, the plurality of chip bonded pads electrically connecting the third semiconductor device to the plurality of second through-electrodes; and
a rewiring structure on a first surface of the first device layer, the first surface of the first device layer being opposite to a second surface of the first device layer that faces the second device layer, the rewiring structure including,
a plurality of rewiring insulating layers,
a plurality of rewiring conductive patterns each on one of top surfaces or bottom surfaces of one of the plurality of rewiring insulating layers, and
a plurality of rewiring via patterns each connecting a vertically neighboring pair of the plurality of rewiring conductive patterns and passing through at least one of the plurality of rewiring insulating layers,
wherein the plurality of rewiring conductive patterns and the plurality of rewiring via patterns are electrically connected to the plurality of first through-electrodes.

2. The semiconductor package of claim 1, wherein the first semiconductor substrate comprises a plurality of first semiconductor chip regions and one or more first scribe lane regions, the plurality of first semiconductor chip regions spaced apart from one another with the one or more first scribe lane regions therebetween.

3. The semiconductor package of claim 2, wherein the second semiconductor substrate comprises a plurality of second semiconductor chip regions and one or more second scribe lane regions, the plurality of second semiconductor chip regions spaced apart from one another with the one or more second scribe lane regions therebetween.

4. The semiconductor package of claim 1, further comprising:
a plurality of external connection terminals contacting the plurality of rewiring conductive patterns and electrically connected to the plurality of first through electrodes.

5. The semiconductor package of claim 1, wherein the second semiconductor substrate has a recess on a surface facing the third device layer, and the upper semiconductor chip is attached to a protrusion of the second semiconductor substrate defined by the recess of the second semiconductor substrate.

6. The semiconductor package of claim 1, wherein the second device layer comprises a plurality of lower semiconductor chips and a filling molding member, the plurality of lower semiconductor chips spaced apart from one another with the filling molding member therebetween, each of the plurality of lower semiconductor chips including the second semiconductor substrate.

7. The semiconductor package of claim 6, wherein the filling molding member has a through-hole accommodating a through-mold via connected to the upper semiconductor chip, and
the semiconductor package further comprises an additional through-electrode that is in a corresponding one of one or more first scribe lane regions included in the first semiconductor substrate, passes through the first semiconductor substrate, and is connected to the through-mold via.

8. The semiconductor package of claim 7, wherein the first semiconductor substrate further includes a plurality of interposer regions each provided between a pair of the one or more first scribe lane regions, the each of the plurality of interposer regions including an additional connection pad connecting the through-mold via to the additional through-electrode.

9. The semiconductor package of claim 6, wherein
the first semiconductor substrate further comprises at least two interposer regions spaced apart from each other with at least one corresponding first scribe lane, from among one or more first scribe lane regions included in the first semiconductor substrate, therebetween,
the filling molding member has a plurality of through-holes in the at least two interposer regions accommodating a plurality of through-mold vias connected to the upper semiconductor chip, and
the at least two interposer regions comprises a plurality of additional through-electrodes passing through the first semiconductor substrate and connected to the plurality of through-mold vias.

10. The semiconductor package of claim 6, wherein
the first semiconductor substrate has a recess on a surface facing the second device layer, and
the plurality of lower semiconductor chips are attached to a protrusion of the first semiconductor substrate defined by the recess of the first semiconductor substrate.

11. The semiconductor package of claim 1, further comprising:
a molding member on the second device layer, the molding member surrounding a top surface of the second device layer and a side surface of the upper semiconductor chip.

12. A semiconductor package comprising:
a first device layer including,
a first semiconductor substrate having an active surface, the first semiconductor substrate including a plurality of first semiconductor chip regions, each of the plurality of first semiconductor chip regions provided with a first semiconductor device on the active surface of the first semiconductor substrate,
a plurality of first through-electrodes in the plurality of first semiconductor chip regions and passing through the first semiconductor substrate, and
a first cover insulating layer covering the active surface of the first semiconductor substrate;
a second device layer including,
a second semiconductor substrate including an active surface, the second semiconductor substrate including a plurality of second semiconductor chip regions, each of the plurality of second semiconductor chip regions provided with a second semiconductor device on the active surface of the second semiconductor substrate, the second semiconductor device being of a same type as the first semiconductor device,
a plurality of second through-electrodes in the plurality of second semiconductor chip regions and passing through the second semiconductor substrate,
a second cover insulating layer covering the active surface of the second semiconductor substrate and in contact with the first cover insulating layer, and
a third cover insulating layer covering an inactive surface opposite to the active surface of the second semiconductor substrate;
a third device layer including,
an upper semiconductor chip including a third semiconductor substrate having an active surface on which a third semiconductor device is located, the upper semiconductor chip being on the second device layer, and
a chip cover insulating layer facing the second device layer and contacting the third cover insulating layer, the chip cover insulating layer covering the active surface of the third semiconductor substrate;

a plurality of device bonded pads passing through the first cover insulating layer and the second cover insulating layer and electrically connecting the first device layer to the second device layer;

a plurality of chip bonded pads passing through the third cover insulating layer and the chip cover insulating layer, the plurality of chip bonded pads electrically connecting the third semiconductor device to the plurality of second through-electrodes; and a rewiring structure on a first surface of the first device layer, the first surface of the first device layer being opposite to a second surface of the first device layer that faces the second device layer, the rewiring structure including, a plurality of rewiring insulating layers, a plurality of rewiring conductive patterns each on one of top surfaces or bottom surfaces of one of the plurality of rewiring insulating layers, and a plurality of rewiring via patterns each connecting a vertically neighboring pair of the plurality of rewiring conductive patterns and passing through at least one of the plurality of rewiring insulating layers, wherein the plurality of rewiring conductive patterns and the plurality of rewiring via patterns are electrically connected to the plurality of first through-electrodes.

13. The semiconductor package of claim 12, further including:

an encapsulation member on the second semiconductor substrate and surrounding a side surface of the upper semiconductor chip.

14. The semiconductor package of claim 12, wherein the first semiconductor substrate further includes one or more first scribe lane regions, and first residual scribe lane regions that surrounds the plurality of first semiconductor chip regions at edges of the first semiconductor substrate, the plurality of first semiconductor chip regions spaced apart from one another with the one or more first scribe lane regions therebetween, the second semiconductor substrate further includes one or more second scribe lane regions, and second residual scribe lane regions that surrounds the plurality of second semiconductor chip regions at edges of the second semiconductor substrate, the plurality of second semiconductor chip regions spaced apart from one another with the one or more second scribe lane regions therebetween, and each of the one or more first scribe lane regions and the one or more second scribe lane regions has a first width, and each of the first residual scribe lane regions and the second residual scribe lane region has a second width, the second width is less than the first width.

15. The semiconductor package of claim 14, further comprising:

a first additional through-electrode in a corresponding one of the one or more first scribe lane regions and passing through the first semiconductor substrate;

a second additional through-electrode in a corresponding one of the one or more second scribe lane regions, passing through the second semiconductor substrate, and electrically connected to the upper semiconductor chip; and an additional bonded pad passing through the first cover insulating layer and the second cover insulating layer and electrically connecting the first additional through-electrode to the second additional through-electrode.

16. The semiconductor package of claim 15, wherein each of the plurality of device bonded pads or the additional bonded pad is a diffusion-bonded integral structure of two sub-structures.

17. The semiconductor package of claim 14, wherein the first semiconductor substrate further includes a first interposer region spaced apart from a corresponding one of the plurality of first semiconductor chip regions with a corresponding one of the one or more first scribe lane regions interposed therebetween, the second semiconductor substrate further comprises a second interposer region spaced apart from a corresponding one of the plurality of second semiconductor chip regions with a corresponding one of the one or more second scribe lane regions interposed therebetween, the first interposer region comprises a plurality of first additional through-electrodes passing through the first semiconductor substrate, the second interposer region comprises a plurality of second additional through-electrodes passing through the second semiconductor substrate and electrically connecting the plurality of first additional through-electrodes to the upper semiconductor chip, and the semiconductor package further comprises a plurality of additional bonded pads passing through the first cover insulating layer and the second cover insulating layer and electrically connecting the plurality of first additional through-electrodes to the plurality of second additional through-electrodes.

18. A semiconductor package comprising:

a first semiconductor substrate including an active surface, the first semiconductor substrate including a plurality of first semiconductor chip regions spaced apart from one another, each of the plurality of first semiconductor chip regions provided with at least one first semiconductor device on the active surface of the first semiconductor substrate;

a plurality of first through-electrodes in the plurality of first semiconductor chip regions and passing through the first semiconductor substrate;

a first cover insulating layer covering the active surface of the first semiconductor substrate;

a plurality of lower semiconductor chips on the first semiconductor substrate and corresponding to the plurality of first semiconductor chip regions, respectively, each of the plurality of lower semiconductor chips including, a second semiconductor substrate having an active surface on which at least one second semiconductor device is located, the second semiconductor substrate including a plurality of second through-electrodes passing therethrough, a second cover insulating layer covering the active surface of the second semiconductor substrate and in contact with the first cover insulating layer, and a third cover insulating layer covering an inactive surface opposite to the active surface of the semiconductor substrate;

a plurality of device bonded pads passing through the first cover insulating layer and the second cover insulating layer and electrically connecting the plurality of first through-electrodes to the plurality of second through-electrodes;

an upper semiconductor chip including a third semiconductor substrate having an active surface on which a third semiconductor device is located, the upper semiconductor chip vertically overlapping at least two of the plurality of lower semiconductor chips;

a chip cover insulating layer facing the plurality of lower semiconductor chips and contacting the third cover insulating layer, the chip cover insulating layer covering the active surface of the third semiconductor substrate;

a plurality of chip bonded pads passing through the third cover insulating layer and the chip cover insulating layer, the plurality of chip bonded pads electrically connecting the third semiconductor device to the plurality of second through-electrodes; and a rewiring structure on a first surface of the first semiconductor substrate, the first surface of the first semiconductor substrate being opposite to a second surface of the first semiconductor substrate that faces the second semiconductor substrate, the rewiring structure including, a plurality of rewiring insulating layers, a plurality of rewiring conductive patterns each on one of top surfaces or bottom surfaces of one of the plurality of rewiring insulating layers, and a plurality of rewiring via patterns each connecting a vertically neighboring pair of the plurality of rewiring conductive patterns and passing through at least one of the plurality of rewiring insulating layers, wherein the plurality of rewiring conductive patterns and the plurality of rewiring via patterns are electrically connected to the plurality of first through-electrodes.

19. The semiconductor package of claim 18, further comprising:

a filling molding member on the first semiconductor substrate, the filling molding member filling spaces between the plurality of lower semiconductor chips.

20. The semiconductor package of claim 18, wherein the first semiconductor device and the second semiconductor device are of a same type, and the third semiconductor device is of a different type from the first semiconductor device and the second semiconductor device.

* * * * *